United States Patent
Moriyama et al.

(10) Patent No.: US 6,314,144 B1
(45) Date of Patent: Nov. 6, 2001

(54) DIGITAL WIRELESS RECEIVING APPARATUS

(75) Inventors: Yukihiro Moriyama; Shigeaki Matsumoto, both of Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/149,870

(22) Filed: Sep. 8, 1998

(30) Foreign Application Priority Data

Mar. 13, 1998 (JP) .................................................... 10-063554

(51) Int. Cl.[7] .......................... H04L 27/06; H04L 27/14; H04L 27/22; H04L 27/08; H03K 9/00
(52) U.S. Cl. .......................... 375/316; 375/230; 375/345
(58) Field of Search .................................. 375/316, 345, 375/230

(56) References Cited

U.S. PATENT DOCUMENTS 2,747,179 * 5/1956 Kaplan .
5,745,531 * 4/1998 Sawahashi et al. .................... 375/345
5,978,415 * 11/1999 Kobayashi et al. .................... 375/230

FOREIGN PATENT DOCUMENTS 9-74555 * 3/1997 (JP) ................................. H04N/7/20
63-16729 * 1/1998 (JP) ................................. H04B/9/00

* cited by examiner

*Primary Examiner*—Stephen Chin
*Assistant Examiner*—Tony Al-Beshrawi
(74) *Attorney, Agent, or Firm*—Helfgott & Karas, PC

(57) ABSTRACT

A digital wireless receiving apparatus performs AGC control. A desired wave level is detected at a modulator, and AGC control is performed for a high frequency portion by detecting a desired wave level at a demodulator. A tap number of a digital filter in the demodulator is controlled or another analog filter of an intermediate frequency detects an input level of an interfering wave or a desired wave, thereby performing AGC control for the high frequency portion and controlling the tap number of the digital filter at the demodulator.

16 Claims, 25 Drawing Sheets

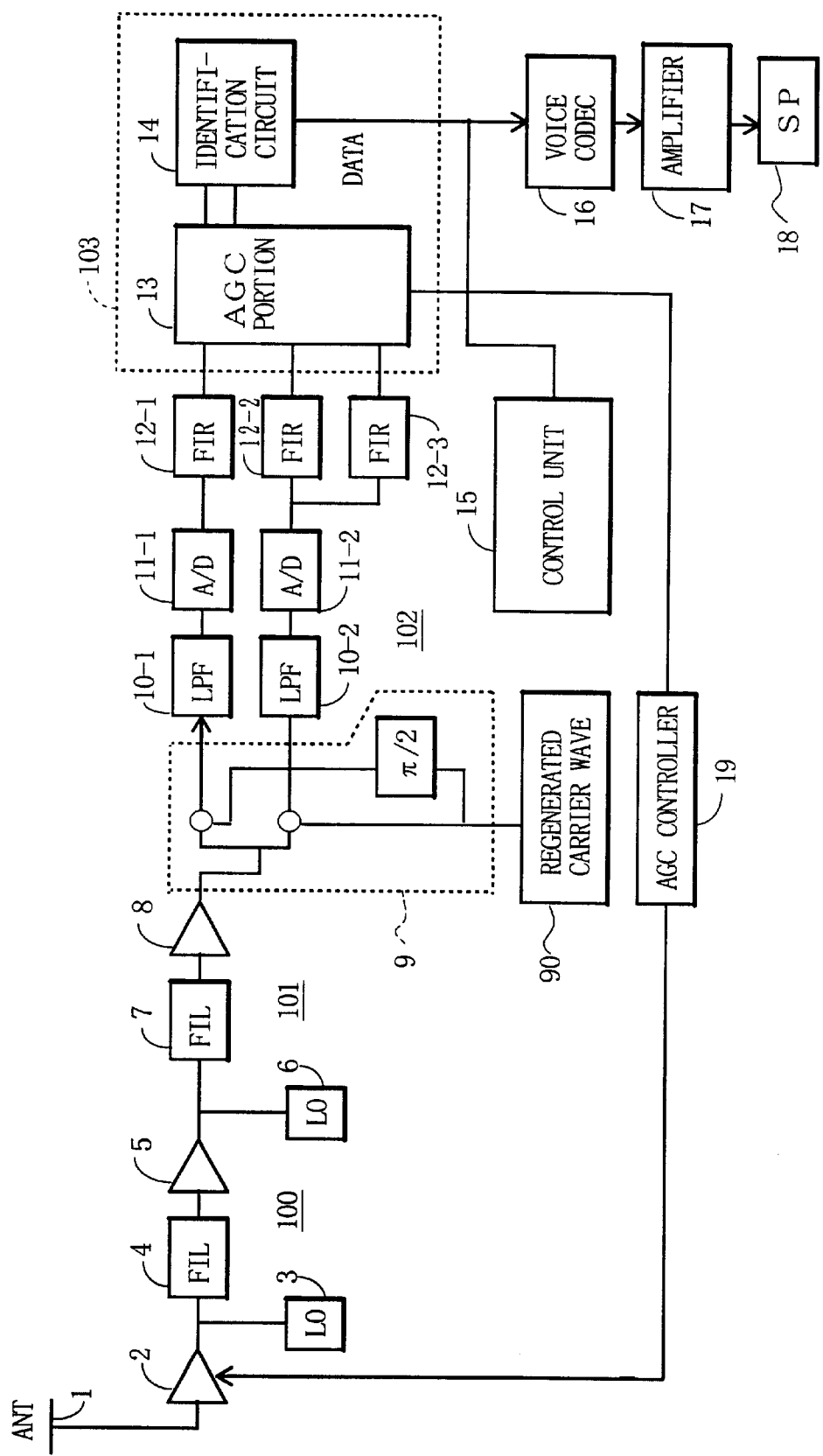

CHARACTERISTIC EXAMPLE
OF FIR'S 12-1,12-2

CHARACTERISTIC
EXAMPLE OF FIR 212-3

ATTENUATION
CHARACTERISTIC

FIR CHARACTERISTIC
EXAMPLE AT
DEMODULATION TIME

ATTENUATION
CHARACTERISTIC

FIR CHARACTERISTIC
EXAMPLE AT AGC
CONTROL TIME

FIR CHARACTERISTIC EXAMPLE UPON
DETECTING ONLY DESIRED WAVE

FIR CHARACTERISTIC EXAMPLE
UPON DETECTING BOTH DESIRED
AND ADJACENT CHANNEL WAVE

FIG.10A

UP (MOBILE STATION → BASE STATION)

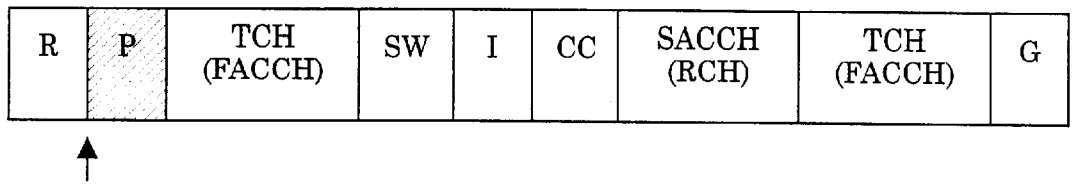

↑
TRANSMISSION START

FIG.10B

DOWN (BASE STATION → MOBILE STATION)

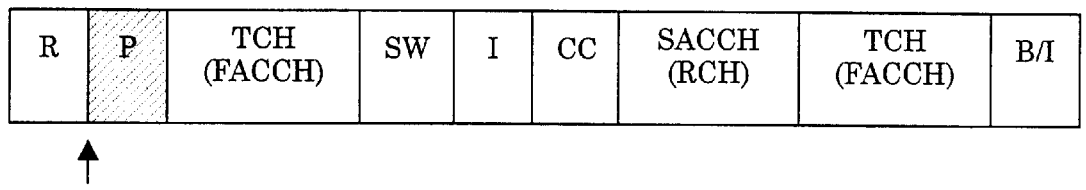

↑
TRANSMISSION START

| | |
|---|---|
| G | : GUARD TIME |
| R | : GUARD TIME FOR BURST TRANSIENT RESPONSE |
| P | : PREAMBLE |
| SW | : SYNCHRONOUS WORD |
| CC | : COLOR CODE(ANTI-INTERFERENCE CODE) |
| TCH | : TRAFFIC CHANNEL |
| FACCH | : FAST SPEED ACCOMPANYING CONTROL CHANNEL |
| SACCH | : SLOW SPEED ACCOMPANYING CONTROL CHANNEL |
| RCH | : HOUSEKEEPING CHANNEL |
| B/I | : BUSY/IDLE BIT |
| I | : IDLE BIT(ALWAYS 0) |
| CI | : CONTROL CHANNEL COMMUNICATION INFORMATION |

ATTENUATION CHARACTERISTIC

GROUP DELAY CHARACTERISTIC f1　f0　f2

CHARACTERISTIC EXAMPLE OF FIR 7

ATTENUATION CHARACTERISTIC

GROUP DELAY CHARACTERISTIC f1　f0　f2

CHARACTERISTIC EXAMPLE OF FIR 20

I : NON-COMMUNICATION SECTION
Rx : RECEIVING SECTION
Tx : TRANSMITTING SECTION

CHARACTERISTIC
EXAMPLE OF FIR 24-1

CHARACTERISTIC
EXAMPLE OF FIR 24-2

PRIOR ART

DIGITAL WIRELESS RECEIVING APPARATUS

BACKGROUND OF THE INVENTION

1. Field of the Invention

The present invention relates to a digital wireless receiving apparatus, and in particular to a wireless apparatus which is used for digital mobile communication.

In recent years, with a stringent condition of frequency resources in wireless communication, a high-efficiency transmission system by digitalization has been generally used. On the other hand, for a channel occupation bandwidth, a narrow one has been demanded.

This demand has been achieved, on a transmitter side, by reducing a roll-off factor and by adopting a linearization art while on a receiver side, an analog filter which is superior in an attenuation characteristic has been developed in order to reduce an interfering wave between adjacent channels. In addition, for the improvement of performance a removal of the interfering wave has been recently attempted with a digital filter.

2. Description of the Related Art

FIG. 22 shows a prior art digital wireless receiving apparatus which uses an analog filter and a digital filter as mentioned above. In this prior art, after being amplified at an RF (Radio Frequency) amplifier 32, an RF reception signal from an antenna (ANT) 31 is transformed into an intermediate frequency (IF) signal (a base band signal) at a mixer 33 with a local oscillation signal from a local oscillator 34. Then the intermediate frequency signal is amplified at an IF amplifier 35 and sent to an IF filter 101. The above components 31–35 form a high frequency portion 100.

The IF filter 101 secures a pass band characteristic in the base band signal, removes an interfering wave and sends the base band signal to a quadrature demodulator 102. In the quadrature demodulator 102, by using a regenerated carrier wave 90, I/Q quadrature components are separated from the base band signal at a quadrature detector 9 and are transformed into digital signals at A/D converters 11-1, 11-2. Then, the digital signals secure the pass band characteristic for demodulation at digital filters (FIR) 12-1, 12-2, and are taken over by an identification portion 103 for the identification operation.

In such a prior art apparatus, the IF filter 101 uses an analog filter with a high selectivity (a high attenuation characteristic) to satisfy a selection characteristic between adjacent channels where the interfering wave exists. Accordingly, the analog filter becomes large in shape and expensive. Also, it is technically difficult to realize an analog filter with a narrow band and a high attenuation characteristic, and is not practical to mount such an analog filter on a base station, especially on a mobile station (a portable device or a car-mounted device).

To avoid such a defect, the IF filter 101 has to use a cheep and small-sized analog filter with a normal pass band and attenuation characteristic. On the contrary, if a demodulator (a base band portion) uses digital filters 12-1, 12-2 which are composed of a DSP or the like to satisfy the above mentioned characteristic (a narrow band and a high attenuation characteristic), a tap number of the digital filter has to be increased, so that and a delay quantity for the demodulation can not be neglected, which is not practical either.

In addition, in a system which provides an adjacent channel selection characteristic with the digital filter there is a tendency that a dynamic range for securing the characteristic becomes small, compared with a system which achieves the same with the prior art analog filter.

To avoid such a defect, after the high frequency portion removes the interfering wave to some extent with a small-sized analog filter, the demodulator has to use the digital filter with a small delay quantity so that the whole receiving system may satisfy the adjacent channel selection characteristic.

In this case, as an attenuation amount of an interfering wave between adjacent channels is greatly influenced by a linear characteristic of a pre-stage circuit of the digital filter, by providing an AGC circuit in the RF amplifier or the like of the pre-stage circuit of the digital filter the linear characteristic has to be secured and the adjacent channel selection characteristic has to be made advantageous.

According to an arrangement shown in FIG. 23, a case will now be considered where an AGC control is executed from the IF filter 101 to the RF amplifier 32 through a level detector 41 and an AGC controller 42.

If a desired electric field wave is inputted from the antenna 31, an output electric field of the IF filter 101 shows two cases where the AGC control is executed and where no AGC control is executed, as shown in FIGS. 24A, 24B respectively.

Assuming that there is an interfering wave which is larger by 60 dB than the desired wave in the adjacent channel and that the removal performance for the adjacent channel of the IF filter 101 is 20 dB, the detected electric fields in FIGS. 24A, 24B become those as shown in FIGS. 25A, 25B respectively by the influence of the interfering wave. That is, if the AGC control system is ruled by the interfering wave and the interfering wave increases in magnitude, the execution of the AGC control will lead desensitization restraining an original gain of the desired wave. Namely, it is impossible to execute an appropriate AGC control in an arrangement shown in FIG. 23.

SUMMARY OF THE INVENTION

It is accordingly an object of the present invention to provide a digital wireless receiving apparatus which can perform a suitable AGC control in addition to avoiding an increase in scale and cost of an analog filter as well as a process quantity (a delay quantity) of a digital filter as much as possible.

[1] To achieve the above-mentioned object, a digital wireless receiving apparatus according to the present invention is arranged to perform an AGC control by using a filter exclusively used for detecting a desired wave which is different from the filter in a demodulation system of FIG. 23 to accurately detect an input level of the desired wave.

Namely, as shown in a schematic arrangement (1) of FIG. 1, in order to remove an interfering wave existing in a frequency band except the desired wave, the IF filter 101 and the first digital filters 12-1, 12-2 have only to possess a pass band characteristic for a 15 demodulation operation different from the prior art shown in FIG. 23. The input level of the desired wave is detected by a second digital filter 12-3 and a level detector 104 which have a high selectivity (a high attenuation characteristic). From the detected result, an AGC controller 105 performs a gain control for an RF amplifier 32 in a high frequency (RF) portion 100.

The attenuation characteristic of the digital filters 12-1, 12-2 is not relatively good, while a tap number is small such that it can be neglected upon the demodulation. Also, the digital filter 12-3 has a high selectivity.

In the above-mentioned arrangement, removal performances of the interfering wave in the IF filter 101, the digital filters 12-1, 12-2 and the digital filter 12-3 are assumed to be 20 dB, 40 dB and 60 dB, respectively.

When the desired wave and the interfering wave the input level of which is the desired wave input level +60 dB are inputted, an input electric field into the level detector 104 reveals a characteristic shown in FIG. 26A and only the input level of the desired wave can be detected, so that the AGC control can be performed by the AGC controller 105 as shown in FIG. 26B. At this time, because the digital filter 12-3 has nothing to do with the demodulation, the high attenuation characteristic can be realized by e.g. making a narrow band without increasing the tap number.

[2] Also, as the above-mentioned invention [1], this invention may use both of the analog filter, and the first and the second digital filters, wherein the tap number or the series stage number of the first digital filter is arranged to be changeable.

A control unit is provided, in which the tap number or the series stage number at the time when the input level of the desired wave detected at the second digital filter and the level detector is high is reduced less than the one at the time when the input level is low. By generating an AGC control signal from the output of the first digital filter in an identification portion and by giving it to the AGC controller the AGC control is performed to the wireless reception signal to secure a linear characteristic.

[3] Also, in this invention, the above-mentioned analog filter and a demodulating digital filter which secures the pass band characteristic and whose tap number or series stage number is changeable may be provided, and a control unit which sets the tap number or the series stage number during the AGC control period larger than that during a demodulation period in order to detect only an input level of the desired wave during the AGC control period based on demodulation data obtained from an output of the digital filter, and an identification portion which generates an AGC control signal from the output digital filter may also be provided.

[4] In addition, the control unit of the above-mentioned invention [3] may change a pass band instead of the tap number or the series stage number.

[5] Moreover, in this invention, the above-mentioned AGC control period may be divided into a period of detecting the input level of the desired wave and a period of detecting the input level of both the desired wave and an adjacent channel, and the AGC controller may be controlled so that an AGC is performed in proportion to the ratio of both of the input levels.

[6] FIG. 2 shows a schematic arrangement (2) of the digital wireless receiving apparatus according to the present invention. In this arrangement, in parallel with the IF filter 101 as a first analog filter, the IF filter 106 as a second analog filter with the high attenuation characteristic is provided, and the desired wave passing through the IF filter 106 is detected at the level detector 107. From this result, the RF amplifier 32 receives the gain control by the AGC controller 108.

Namely, assuming that the interfering wave removal performance of the IF filter 106 is 80dB, when the desired wave and the interfering wave (the input level of the interfering wave=the input level of the desired wave +60 dB) are inputted, the input electric field in the level detector 107 reveals the characteristic shown in FIG. 26A, so that only the input level of the desired wave can be detected at the level detector 107 and the AGC control can be performed by the AGC controller 108 as shown in FIG. 26B. At this time, the IF filter 106 for detecting the desired wave may be formed of filters at the cost of the band characteristic and a group delay characteristic or the like. Accordingly, it is possible to use a small and cheap filter and to secure the performance with keeping the increase in cost least.

[7] In this invention, in the above-mentioned invention [6], a switch which switches over outputs of the above-mentioned first and second analog filter, and a control unit which controls the switch so as to select an output of the second analog filter only during the AGC control period based on demodulation data obtained from an output of the digital filter may be provided, and by detecting an input level of the desired wave from an output signal of the switch, the AGC control may be performed as mentioned above.

[8] Also, in this invention, as the above-mentioned second analog filter may comprise a filter which has a low and a high pass band which pass an interfering wave therethrough, and an input level of the interfering wave may be detected from an output signal of the second analog filter, and the AGC control may be performed in inverse proportion to the detected level.

[9] Also in this invention, in the above-mentioned invention [6], an input level of the desired wave detected at the second analog filter and the level detector may be given to the control unit, which may change over the tap number or the series stage number of the digital filter in the demodulator.

[10] Also, for the above-mentioned AGC control period, a preamble period may be used.

[11] Alternatively, for the AGC control period, a non-communication section in the TDMA or TDD communication method may be used.

[12] Also in this invention, in the above-mentioned invention [6], a control unit may be provided which sets the tap number or the series stage number during the AGC control period larger than that during a demodulation period in order to detect only an input level of the desired wave during the AGC control period based on demodulation data obtained from an output of the digital filter.

The AGC control may also be performed to the wireless reception signal according to the sum of the detected level by the level detector and the AGC control signal.

[13] In this invention, in the above-mentioned invention [8], electric power of the interfering wave may be detected from the level detector during the AGC control period by the TDMA or the TDD method, and a control unit may be provided which controls the tap number or the series stage number of the digital filters during the demodulation period according to the electric power of the interfering wave.

[14] Moreover, in each of the above-mentioned inventions, the AGC controller may control a reference voltage of an A/D converter positioned in a pre-stage of the demodulating digital filter.

BRIEF DESCRIPTION OF THE DRAWINGS

FIG. 3 is a block diagram showing an embodiment (1) of a digital wireless receiving apparatus according to the present invention;

FIGS. 10A and 10B are format diagrams of a receiving frame used in a digital wireless receiving apparatus according to the present invention;

Throughout the figures, like reference numerals indicate like or corresponding components.

DESCRIPTION OF THE EMBODIMENTS

Figure 1:
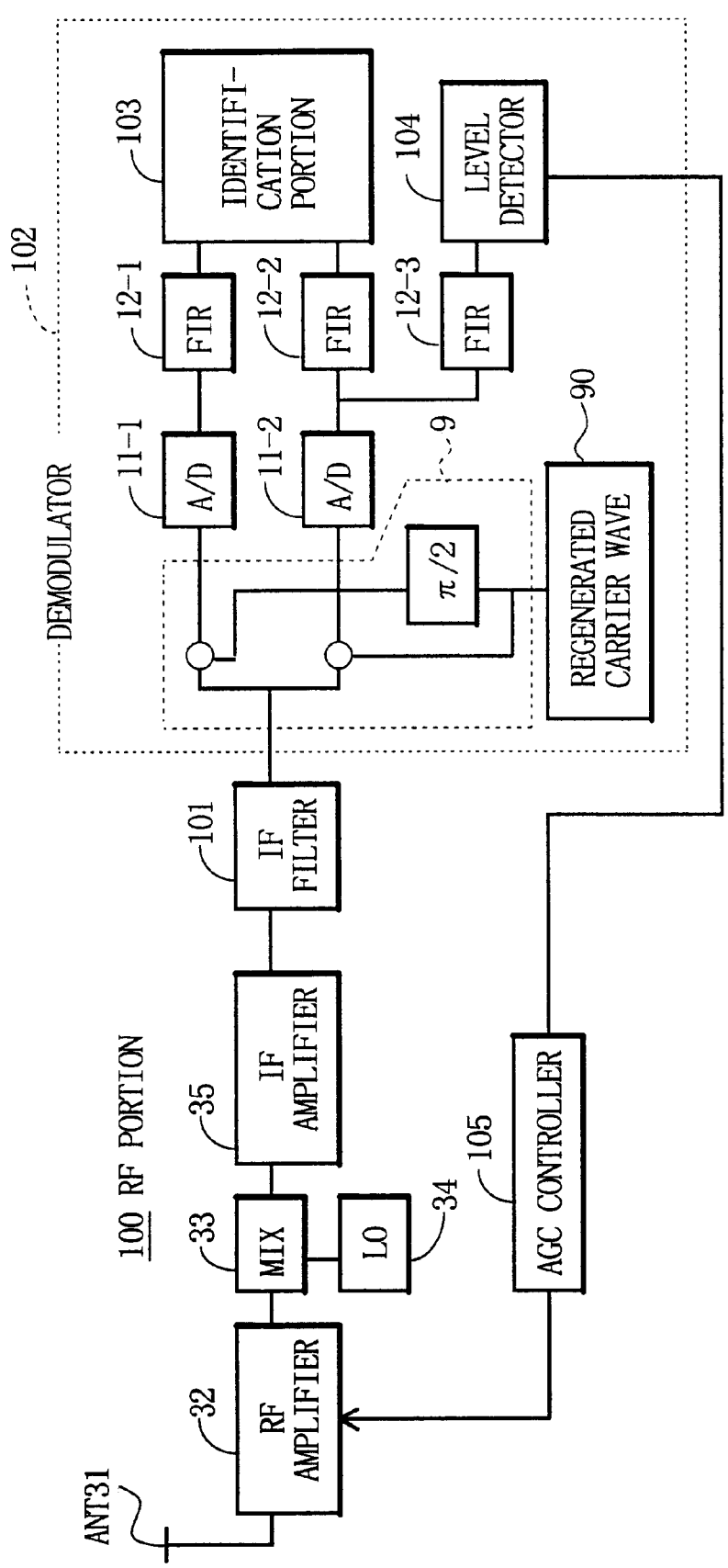
FIG. 1 is a block diagram illustrating a principle (1) of a digital wireless receiving apparatus according to the present invention.

FIG. 3 shows an embodiment (1) of a digital wireless receiving apparatus according to the present invention, and particularly shows an embodiment of the schematic arrangement in FIG. 1. In this embodiment, the antenna 31 shown in FIG. 1 corresponds to an antenna 1, and the RF amplifier 32 corresponds to an amplifier 2. Also, the combination of the mixer 33, the local oscillator 34, and the IF amplifier 35 in FIG. 1 corresponds to that of a local oscillator 3, an analog filter 4, an amplifier 5, and a local oscillator 6. The IF filter 101 is composed of an analog filter 7 and an amplifier 8. The analog filters 4, 7 are made of crystal, ceramic, or the like.

In addition, at the pre-stages of the A/D converters 11-1, 11-2, low pass filters (LPF) 10-1, 10-2 are provided respectively in order to remove high frequency components. Also, the identification portion 103 in FIG. 1 is composed of an AGC (LOT/AFC/AGC) portion 13 and an identification circuit 14 to set up a reception timing. Moreover, the AGC portion 13 has a level detection function corresponding to the level detector 104 shown in FIG. 1.

The identification circuit 14 is connected to a voice CODEC 16, an amplifier 17 and a speaker 18, and identified data are outputted as voice from the speaker 18. Also, the digital filters 12-1–12-3 are composed of a DSP, for instance.

Figure 4A:
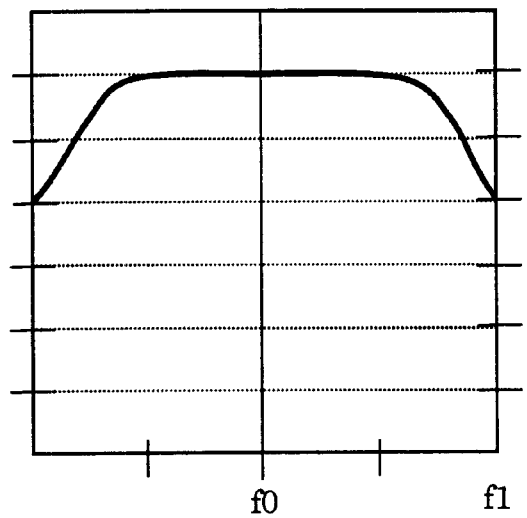
FIGS. 4A and 4B are graphs showing characteristic examples of a digital filter used in a digital wireless receiving apparatus according to the present invention.
Figure 4B:
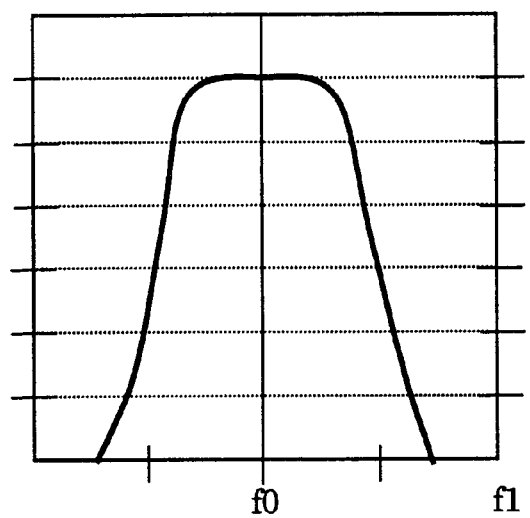

In operation of such an embodiment, a base band signal sent to the quadrature demodulator 102 through the high frequency portion 100 and the IF filter 101 becomes accurate AGC information by removing an interfering wave with the digital filters 12-1, 12-2 tuned for the detection of an adjacent channel of a desired wave as shown in a frequency characteristic of FIG. 4A. The digital filter 12-3 has only to possess a center frequency f0 at which only an input level of the desired wave as shown in FIG. 4B can be extracted and has nothing to do with the demodulation, so that there is an advantage that the digital filter can be composed of fewer taps because a pass band characteristic can be neglected.

The AGC portion 13 detects an electric power level of the desired wave from an output signal of the digital filter 12-3. By sending this detected information to the AGC controller 19 to perform the AGC control, a demodulating signal is demodulated through the filters 12-1, 12-2.

Figure 5:
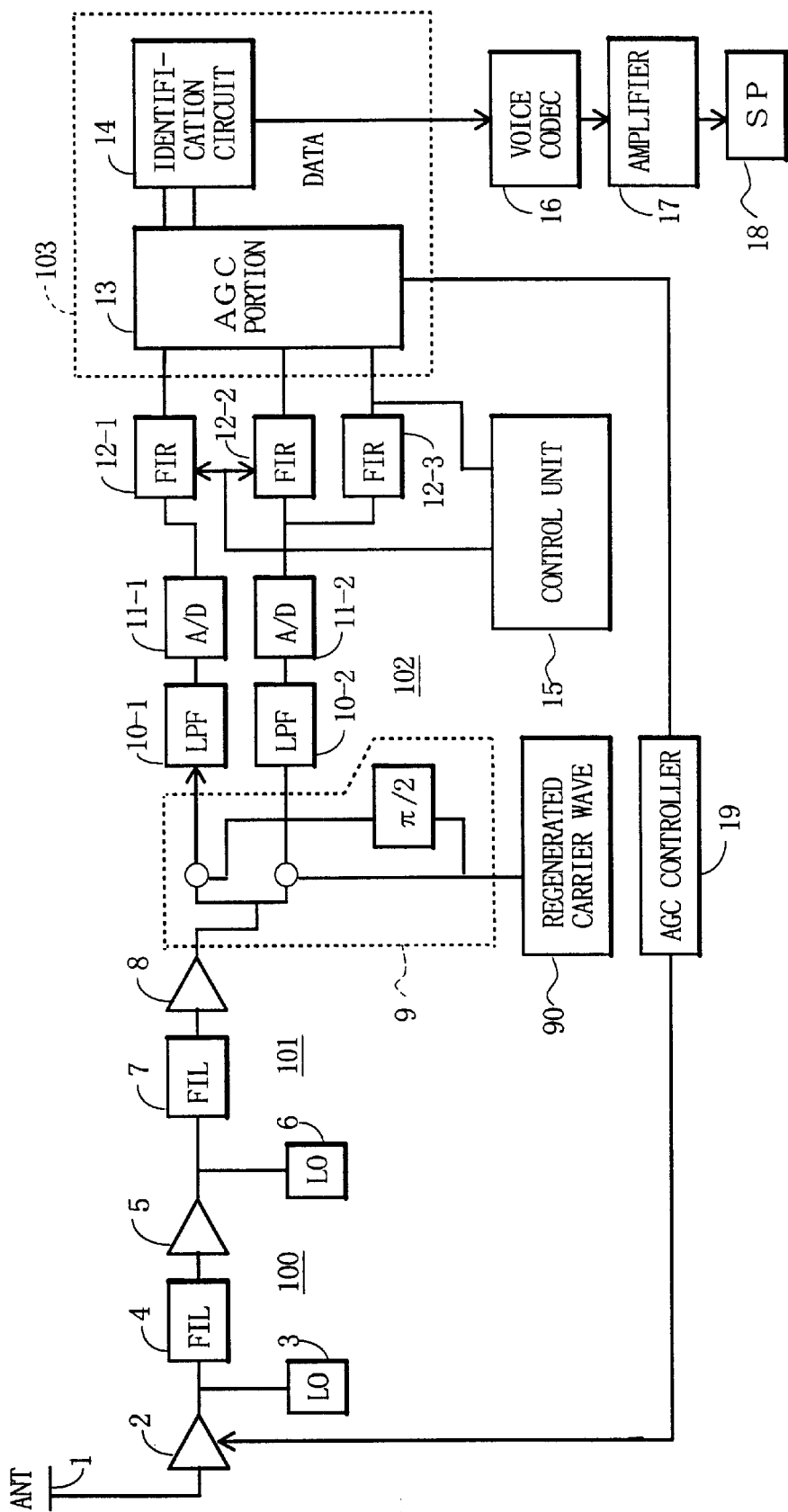
FIG. 5 is a block diagram showing an embodiment (2) of a digital wireless receiving apparatus according to the present invention.

FIG. 5 shows an embodiment (2) of a digital wireless receiving apparatus according to the present invention, and particularly shows a modified example of the embodiment in FIG. 3. In this embodiment, the output signal of the digital filter 12-3 is given not only to the AGC portion 13 but also to the control unit 15. Also, it is arranged that the tap number or the series stage number of the digital filters 12-1, 12-2 is changeable and the control unit 15 variably controls the tap number or the series stage number of the digital filters 12-1, 12-2 based on the output signal of the digital filter 12-3.

In operation, the control unit 15 detects the level of the desired wave by the digital filter 12-3 with a narrow band and a high selectivity. When the desired wave level is high, the interfering wave is less influenced than when the desired wave level is low. Therefore, the tap number or the series stage number of the digital filters 12-1, 12-2 is made less than that at the time when it is required to remove the interfering wave. Thus, a delay quantity and a process quantity of the digital filters 12-1, 12-2 are decreased.

Figure 6:
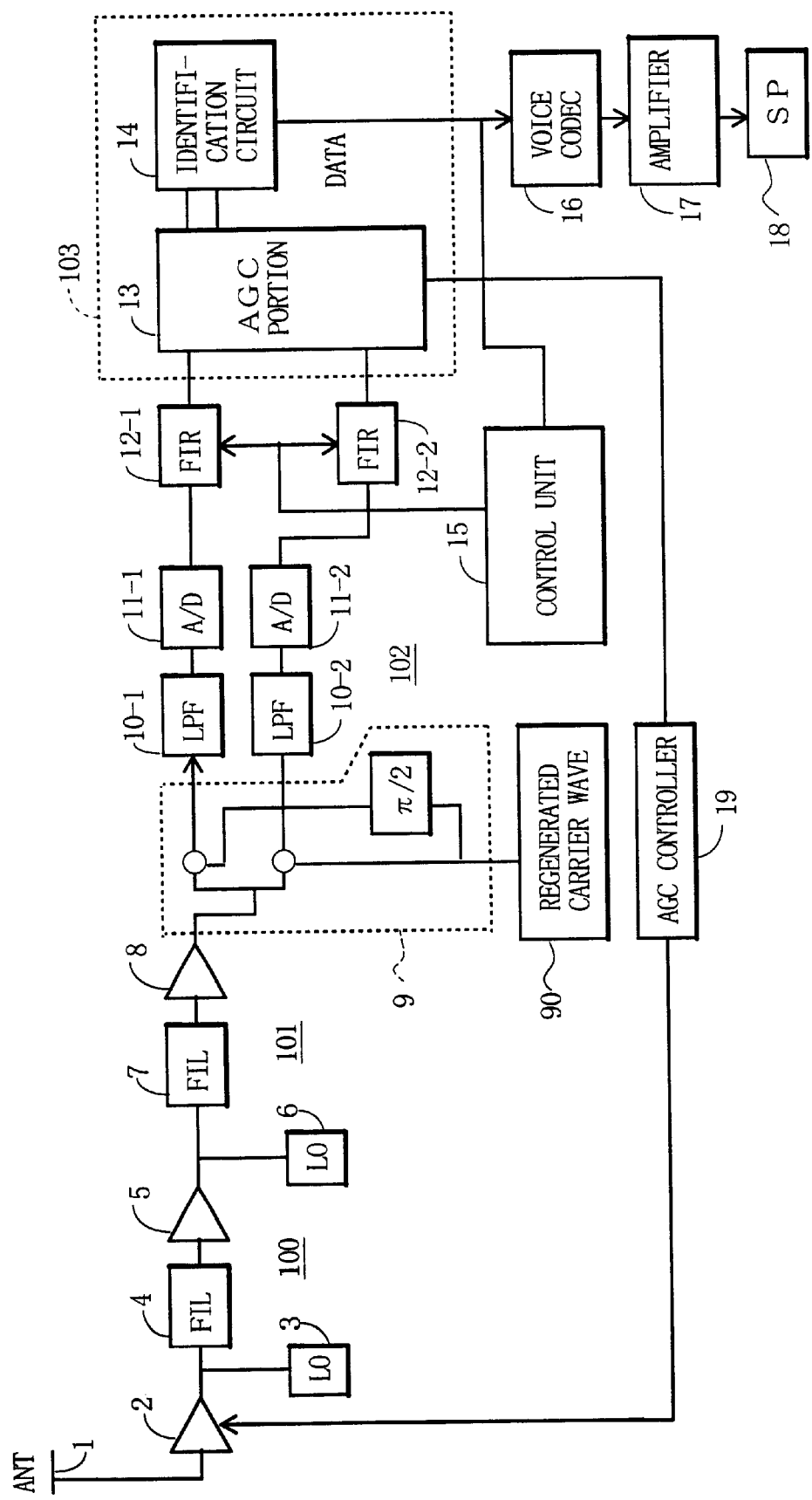
FIG. 6 is a block diagram showing an embodiment (3) of a digital wireless receiving apparatus according to the present invention.

FIG. 6 shows an embodiment (3) of a digital wireless receiving apparatus according to the present invention, and particularly shows a modified embodiment of FIG. 3. This embodiment also shows the case where the AGC control is performed by the electric field information on the output side of the digital filter of the demodulator 102. It is arranged that the digital filters 12-1, 12-2 are composed of filters whose tap number or the series stage number can be changed and the control unit 15 controls the digital filters 12-1, 12-2 by dividing an AGC control period (non-receiving period) from a demodulation period (receiving period) based on the output data of the identification circuit 14.

Figure 7:
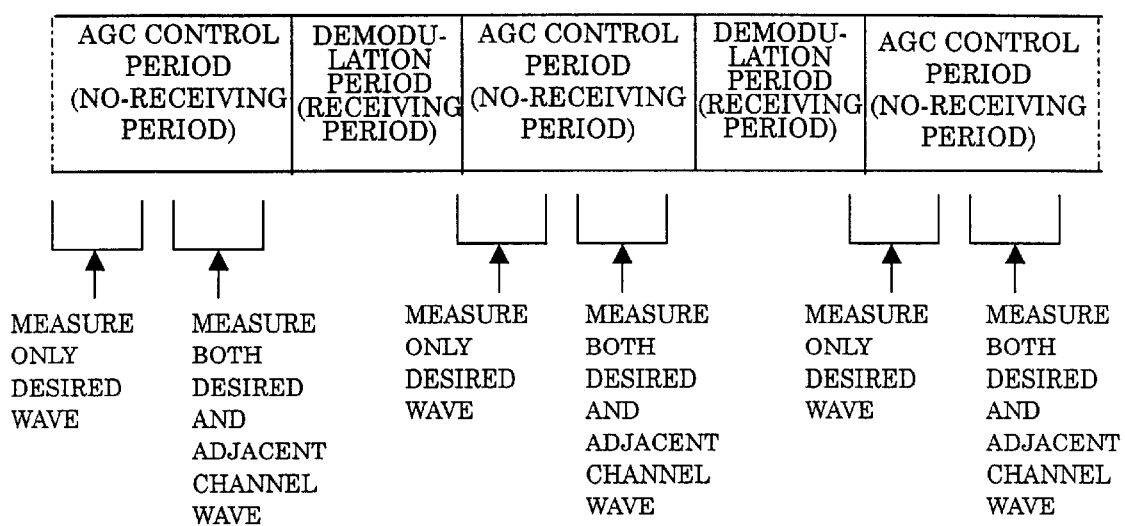
FIG. 7 is a format diagram of a receiving frame showing a timing of electric field measurement used in a digital wireless receiving apparatus according to the present invention.

In operation, the control unit 15 determines the AGC control period (non-receiving period)/the demodulation period (receiving period) in a present receiving frame from the data of the identification circuit 14. The receiving frame is divided into the AGC control period and the demodulator period as shown in FIG. 7, and the AGC control period is further divided into a period of measuring only the desired wave and a period of measuring both of the desired wave and the adjacent channels.

Figure 8A:
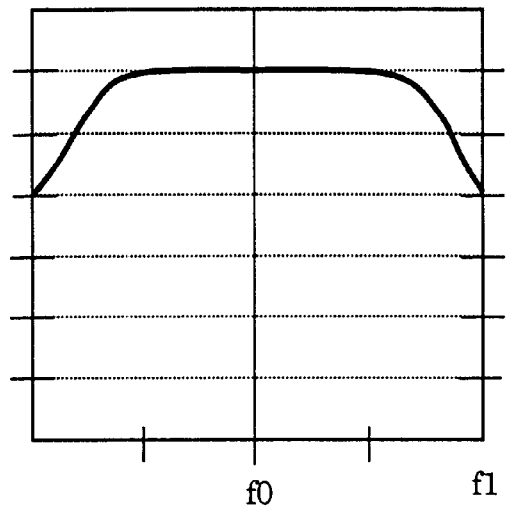
FIGS. 8A and 8B are graphs showing characteristic examples of a digital filter used in the embodiment (3) of the present invention.
Figure 8B:
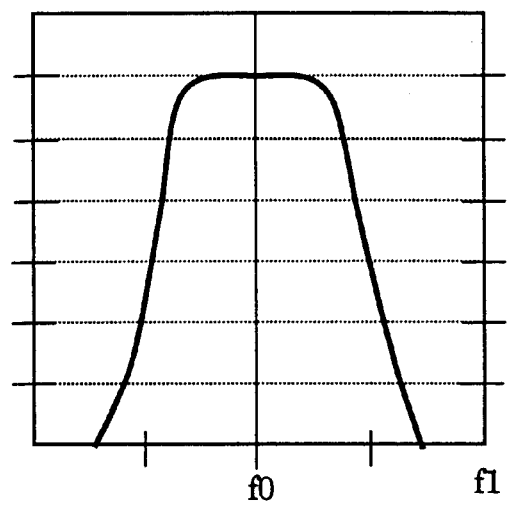

Accordingly, the control unit 15 sets the tap number or the series stage number of the digital filters 12-1, 12-2 large so that the received data during the demodulation period may reveal the filter characteristic shown in FIG. 8A. Also, the control unit 15 sets the tap number or the series stage number of the digital filters 12-1, 12-2 small so that during the AGC control period the received data may reveal the filter characteristic shown in FIG. 8B. This arrangement enables the above-mentioned digital filter 12-3 to be deleted.

This control can be performed by the control unit 15, e.g. CPU making tabled filter information preset in a ROM and giving the information to the digital filters 12-1, 12-2.

Although in the above-mentioned description the control unit 15 controls the tap number or the series stage number of the digital filters 12-1, 12-2, it is also possible to control a pass band of the digital filters instead of the tap number or the series stage number.

Figure 9A:
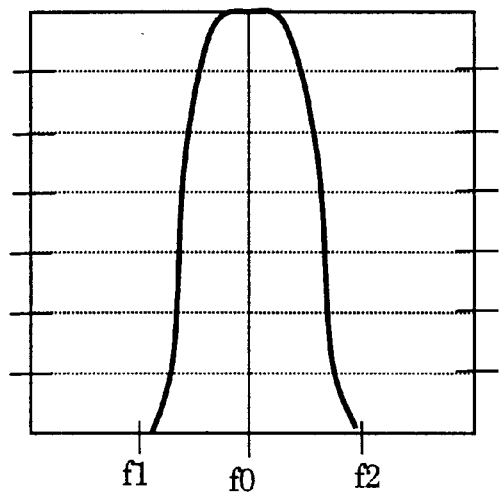
FIGS. 9A and 9B are graphs showing other characteristic examples of a digital filter used in the embodiment (3) of the present invention.
Figure 9B:
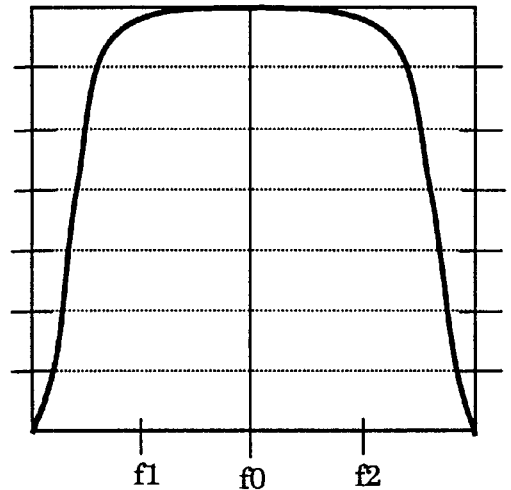

Also, with respect to the AGC control period for measuring a received electric field, the control unit 15 can further divide it into a period for detecting only the desired wave as shown in FIG. 9A and a period for detecting both of the desired wave and the interfering wave as shown in FIG. 9B, and the AGC controller 13 which has measured the respective electric field strengths controls the AGC controller 19 so as to perform the AGC control in proportion to the ratio of both electric field strengths and to adjust the amplification degree of the amplifier 2.

FIG. 10 shows a format of the above-mentioned receiving frame. FIG. 10A shows an up frame from a mobile station to a base station, and FIG. 10B shows a down frame from the base station to the mobile station oppositely. In such a receiving frame, at the beginning of transmission, a preamble period P is included as a period which is required until the transmission output is stabilized, and this preamble period P can be used as the above-mentioned AGC control.

Figure 2:
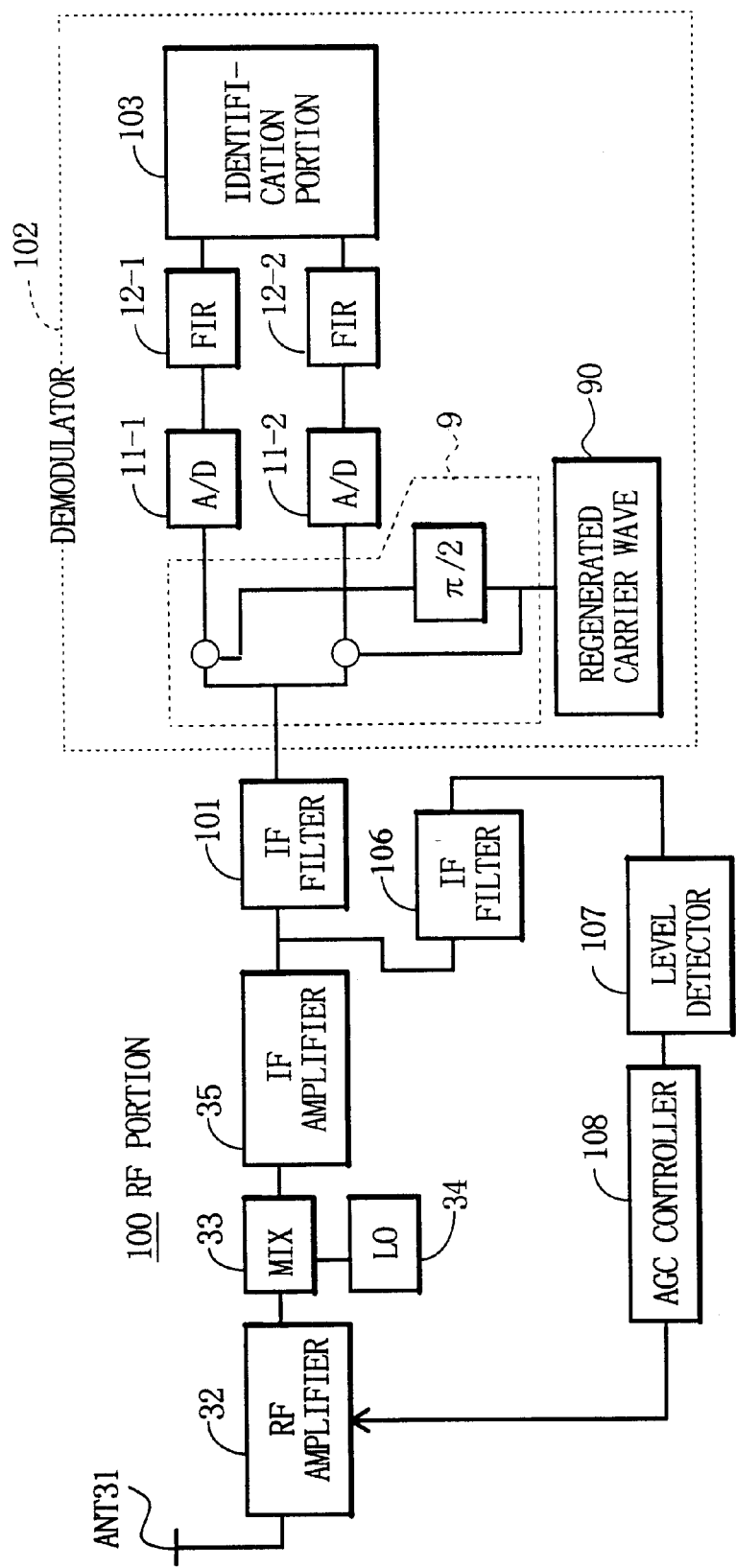
FIG. 2 is a block diagram illustrating a principle (2) of a digital wireless receiving apparatus according to the present invention.
Figure 11:
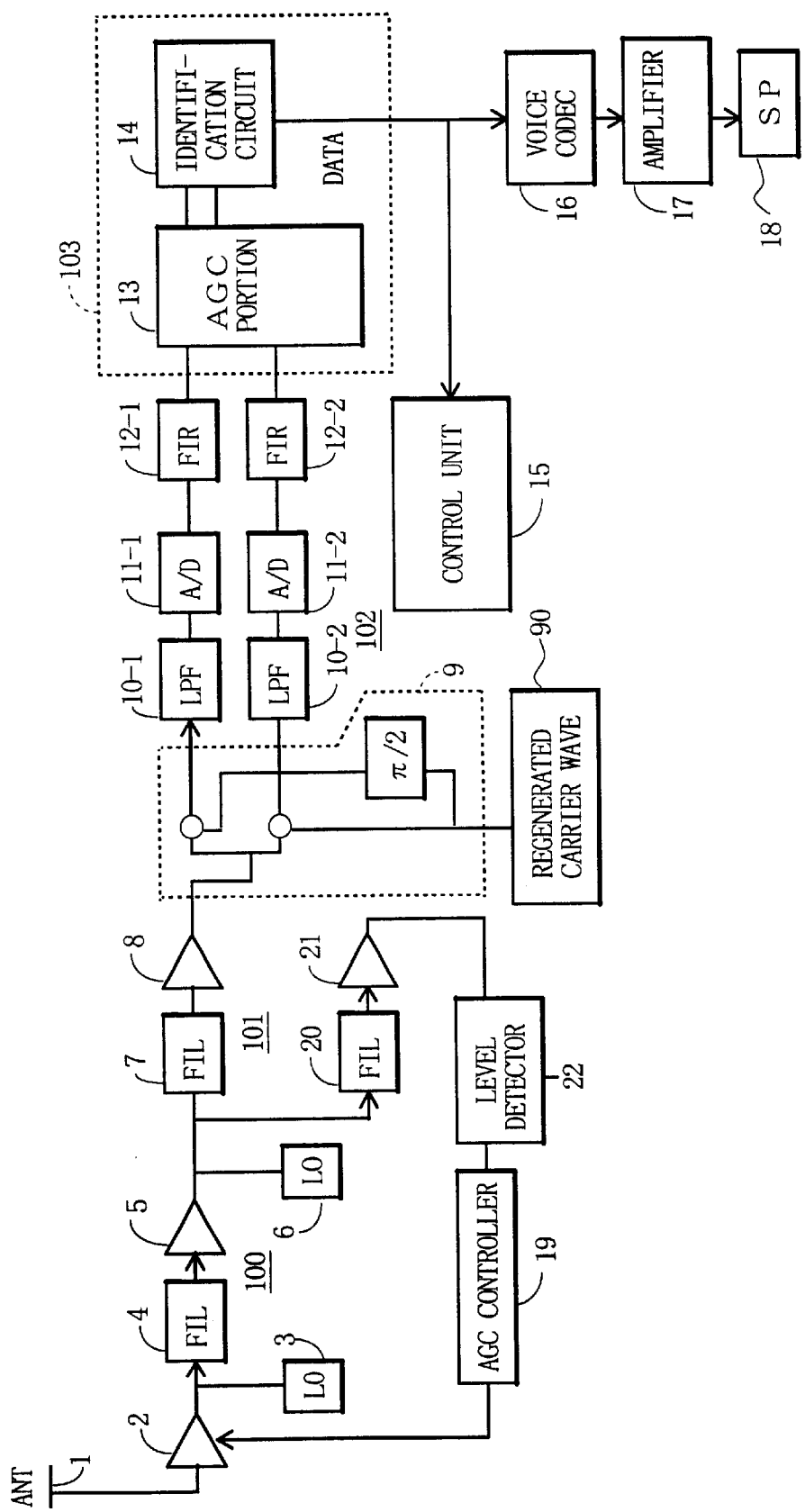
FIG. 11 is a block diagram showing an embodiment (4) of a digital wireless receiving apparatus according to the present invention.

FIG. 11 shows an embodiment (4) of the digital wireless receiving apparatus according to the present invention, and particularly shows an embodiment of the schematic arrangement of FIG. 2. In this embodiment, in addition to the IF filter 7 as the first analog filter, the combination of a filter (FIL) 20 and an amplifier 21 is used as the IF filter 106 in FIG. 2 (the second analog filter). The level detector 107 corresponds to a level detector 22, and the AGC controller 108 corresponds to an AGC controller 19. Other parts are the same as in the above-mentioned embodiments.

Figure 12A:
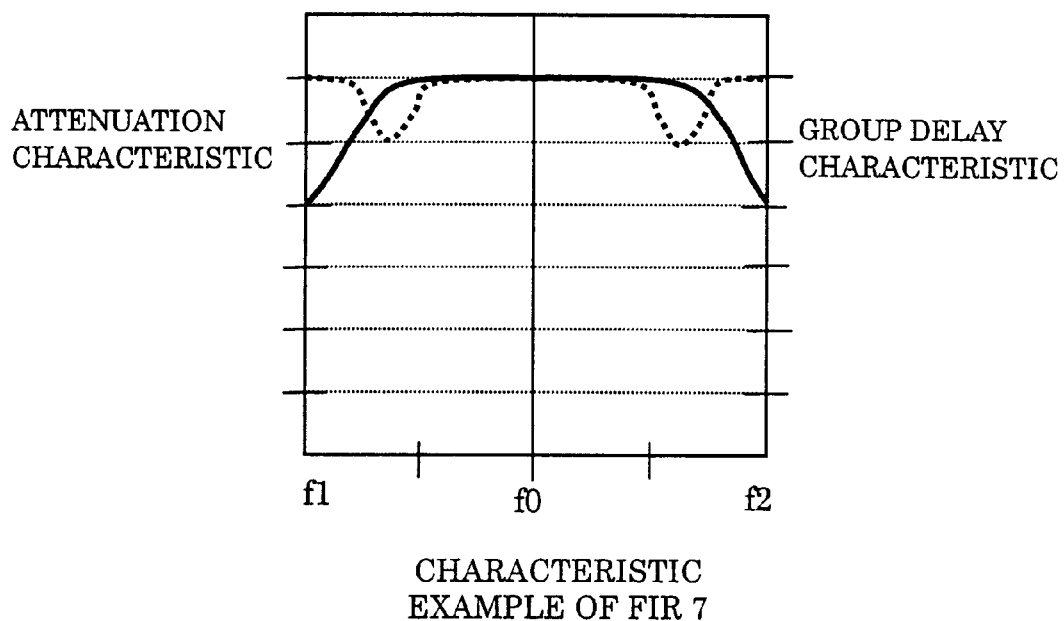
FIGS. 12A and 12B are graphs showing characteristic examples of a first and a second analog filter used in the embodiment (4) of the present invention.
Figure 12B:
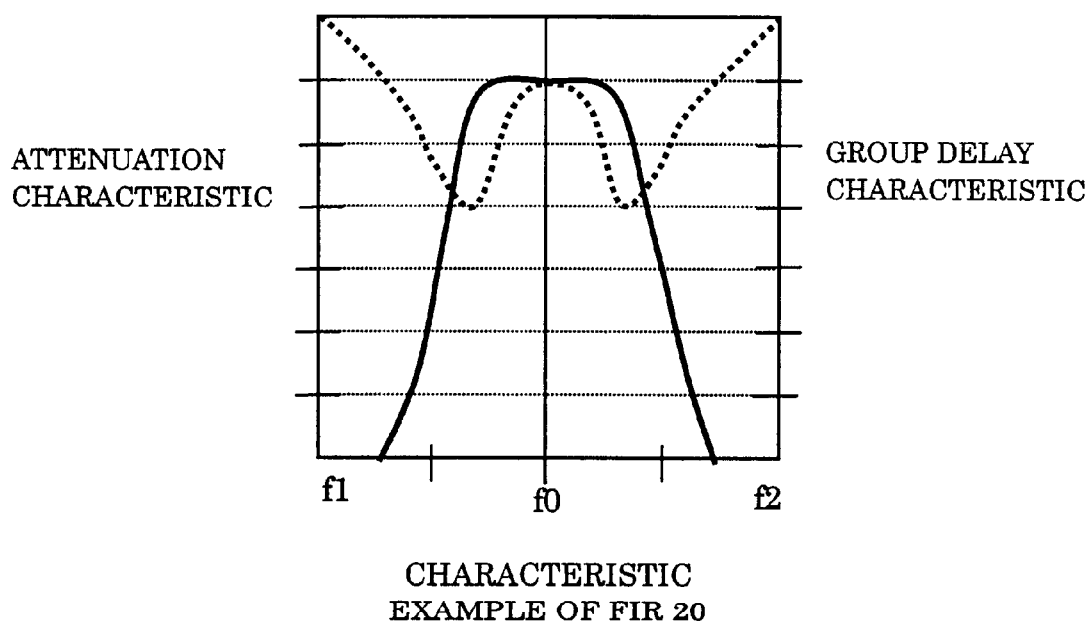

It is to be noted that the filter 7 has a normal intermediate frequency band characteristic as shown in FIG. 12A, and the filter 20 has a high selectivity (high attenuation degree) characteristic with respect to the desired wave frequency f0 as shown in FIG. 12B.

Namely, the filter 20 and the level detector 22 detect the input level of the desired wave. This input level enables the AGC control, thereby preventing the AGC control from its malfunction due to the adjacent channel's interfering wave (at frequency f1).

Figure 13:
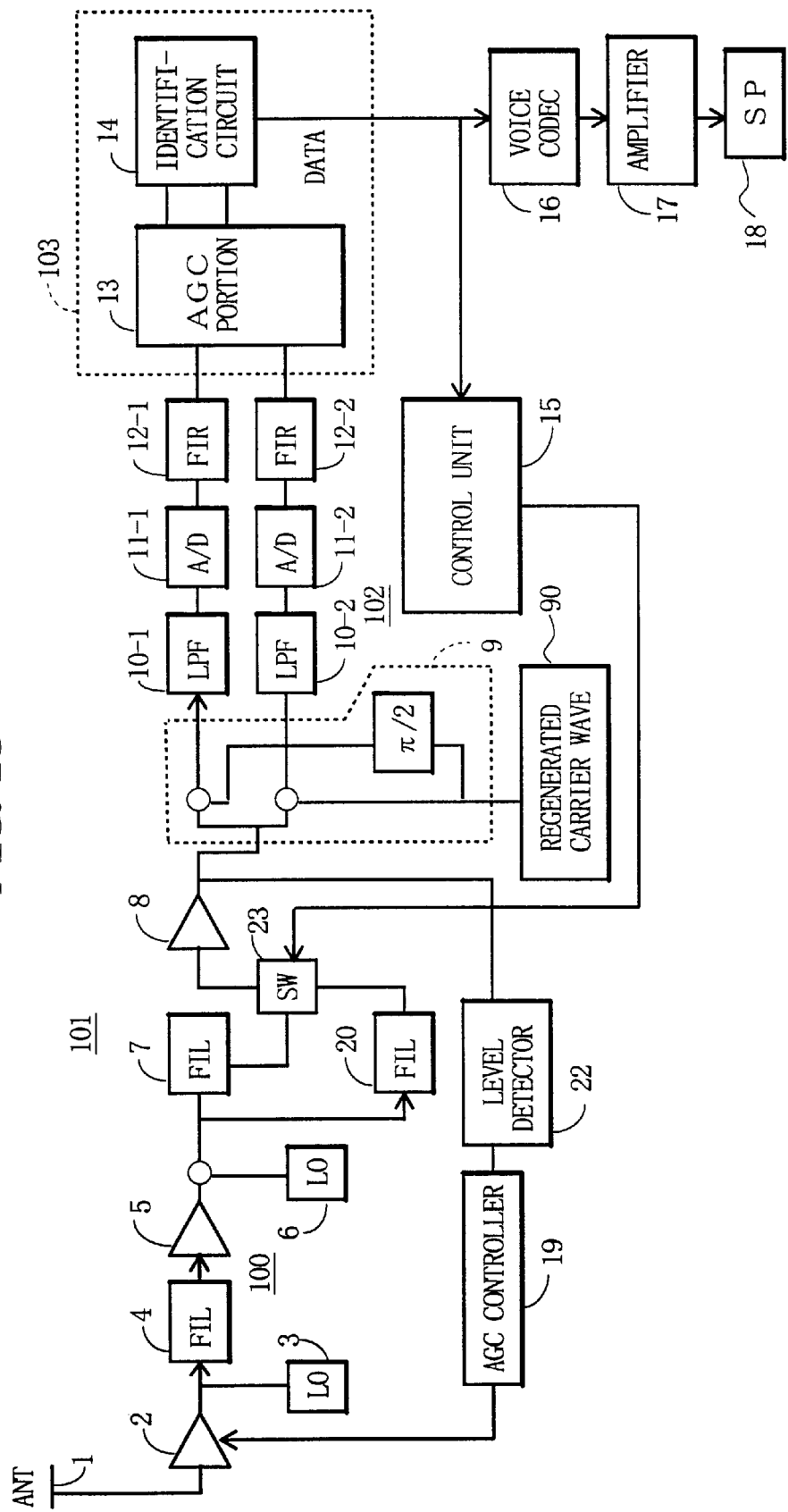
FIG. 13 is a block diagram showing an embodiment (5) of a digital wireless receiving apparatus according to the present invention.

FIG. 13 shows an embodiment (5) of the digital wireless receiving apparatus according to the present invention, and particularly shows a modified example of the embodiment in FIG. 11. In this embodiment, the output terminals of the filters 7, 20 are connected to a switch (SW) 23, the output signal of the switch 23 is given to the amplifier 8, and the level detector 22 and the AGC controller 19 perform the AGC control with the output signal of the amplifier 8. Moreover, the switch 23 is connected to have a switchover control from the control unit 15.

In operation, the control unit 15 acknowledges the timing of digital communication (see FIG. 7) with the received data from the identification circuit 14. During the AGC control period the switch 23 is connected to the filter 20 on the AGC side, and during the demodulation period, it is switched to the demodulating filter 7.

Thus, by performing the time division control to the AGC control period and the demodulation period, amplifiers (8, 21 in FIG. 11) of the following stage of the filters 7, 20, which are also for an RSSI detection of the AGC control, are shared, resulting in a decrease in cost and a miniaturization.

Figure 14:
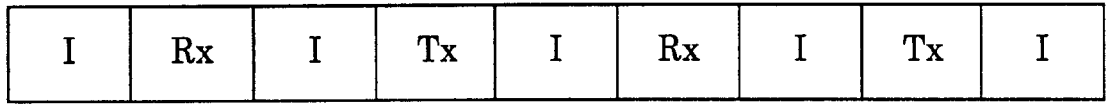
FIG. 14 is a format diagram of a receiving frame according to the TDMA or TDD communication method used in the embodiment (5) of the present invention.

As the AGC control period in this embodiment, non-communication (receiving) section I in the transmission-reception time slot arrangement according to the TDMA or the TDD communication method shown in FIG. 14 may be used.

Figure 15:
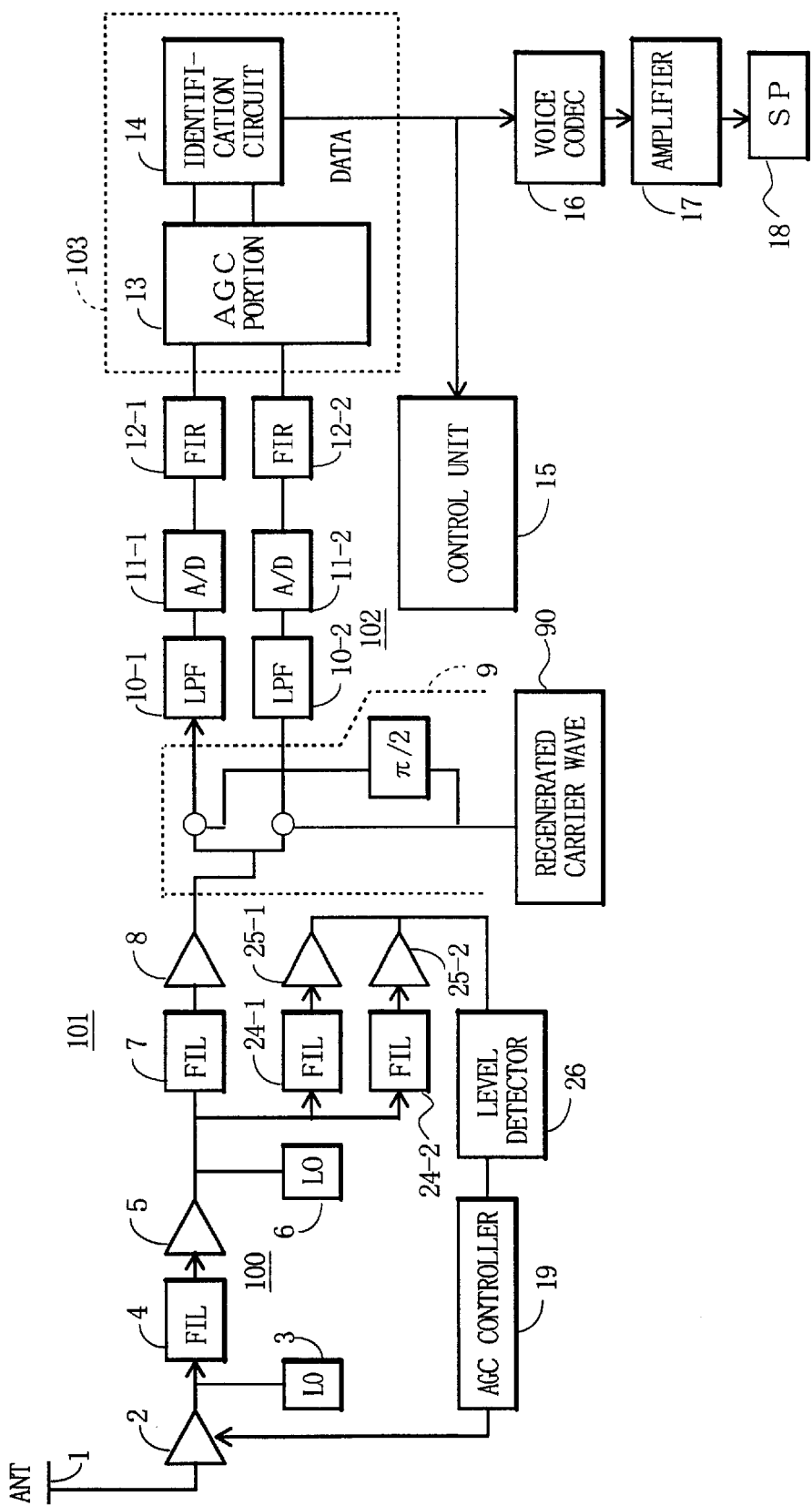
FIG. 15 is a block diagram showing an embodiment (6) of a digital wireless receiving apparatus according to the present invention.
Figure 16A:
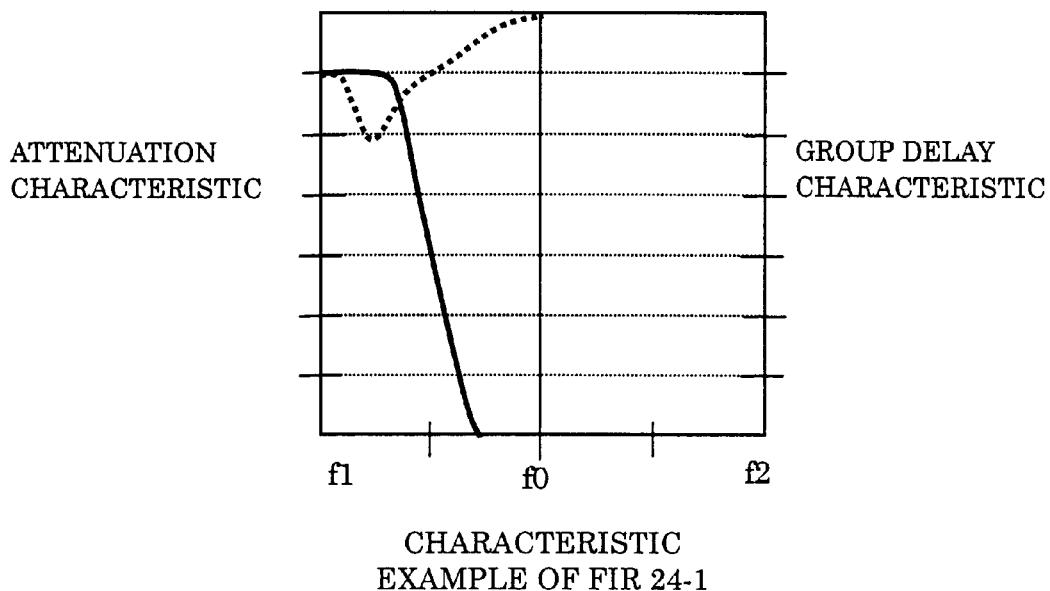
FIGS. 16A and 16B are graphs showing characteristic examples of the second analog filter used in the embodiment (6) of the present invention.
Figure 16B:
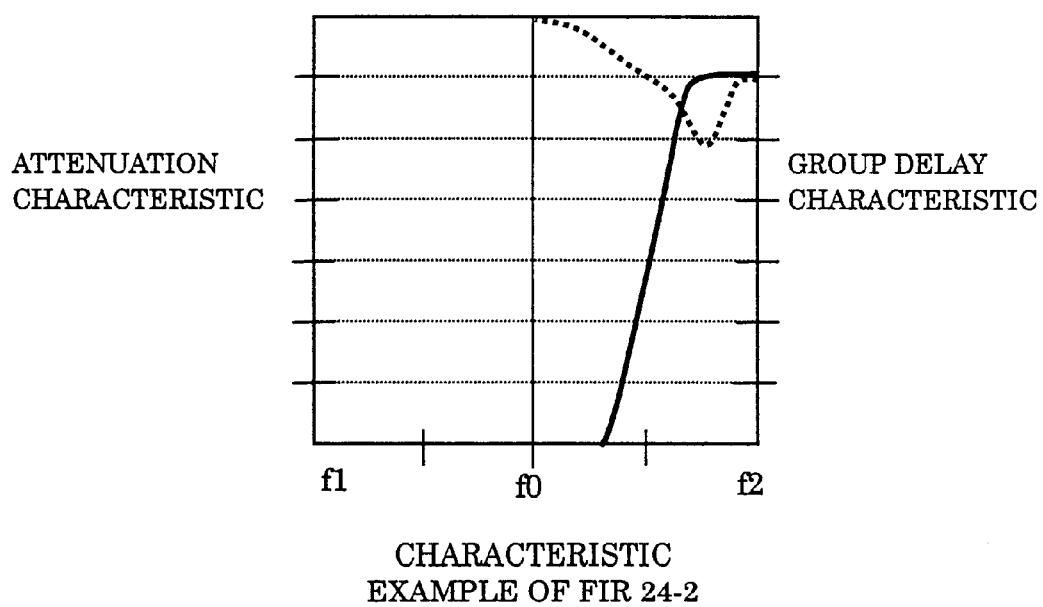

FIG. 15 shows an embodiment (6) of the digital wireless receiving apparatus according to the present invention, and particularly shows a modified example in FIG. 11. In this embodiment, instead of the analog filter 20 and the amplifier 21 in FIG. 11, an AGC system is added by filters 25-1, 25-2 as the second analog filter which has the adjacent channels f1, f2 to the center frequency f0 as the respective pass bands, as shown in FIG. 16A and 16B.

Namely, in view of the fact that an actual interfering wave is caused by the adjacent channel, the input level of the interfering wave is detected by the filters 24-1, 25-1, 24-2, 25-2 to perform the AGC control. In this case, however, the AGC control is performed in inverse proportion to the input level of the interfering wave. As a result, it becomes possible to prevent the AGC from its malfunction due to the adjacent channel's obstruction.

The filters 24-1, 25-1, 24-2, 25-2 whose pass bands are the adjacent channels require only electric power information and neither a group delay characteristic nor the attenuation characteristic matters, so that if a ceramic filter or the like is used, it is possible to realize a smaller and cheaper filter.

Figure 17:
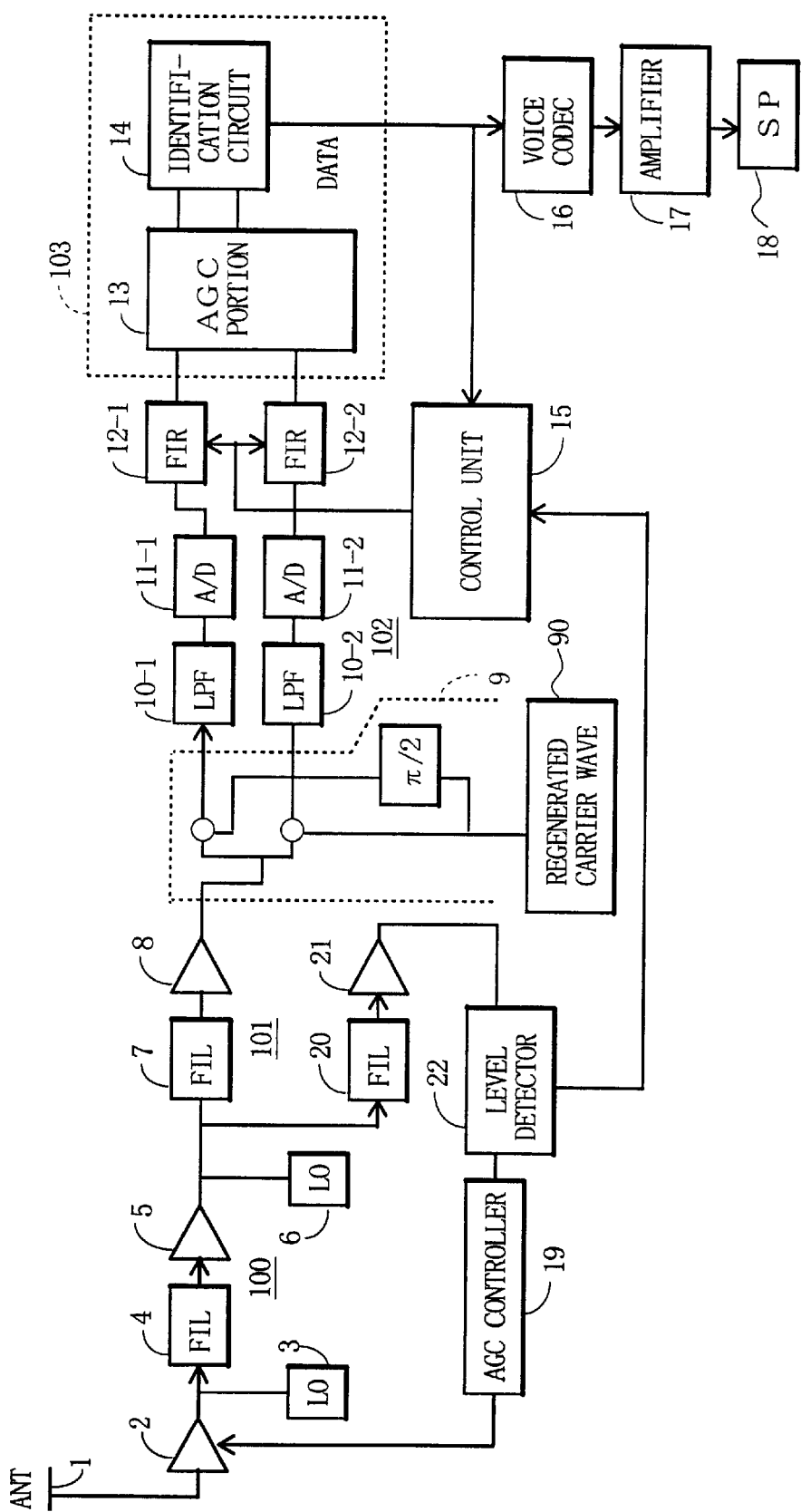
FIG. 17 is a block diagram showing an embodiment (7) of a digital wireless receiving apparatus according to the present invention.

FIG. 17 shows an embodiment (7) of the digital wireless receiving apparatus according to the present invention, and particularly shows a modified example in FIG. 11. In this embodiment, since the desired wave is comparatively accurately detected on purpose in FIG. 2 (and FIG. 11), it is tried to reduce the load of the demodulation portion 102 at the following stage by utilizing the detected information.

Namely, the control unit 15 which has received the electric field information of the desired wave signal detected at the level detector 22 from the second analog filter 20 is arranged to control the tap number or the series stage number of the digital filters 12-1, 12-2. Therefore, when the desired wave level is large, the tap number or the series stage number of the digital filters 12-1, 12-2 are decreased while to the contrary that is increased, or the filtering shape is made cutting. This prevents the delay due to the digital process, and when the filter is composed of the DSP or the like, it becomes possible to reduce arithmetic processes.

Figure 18:
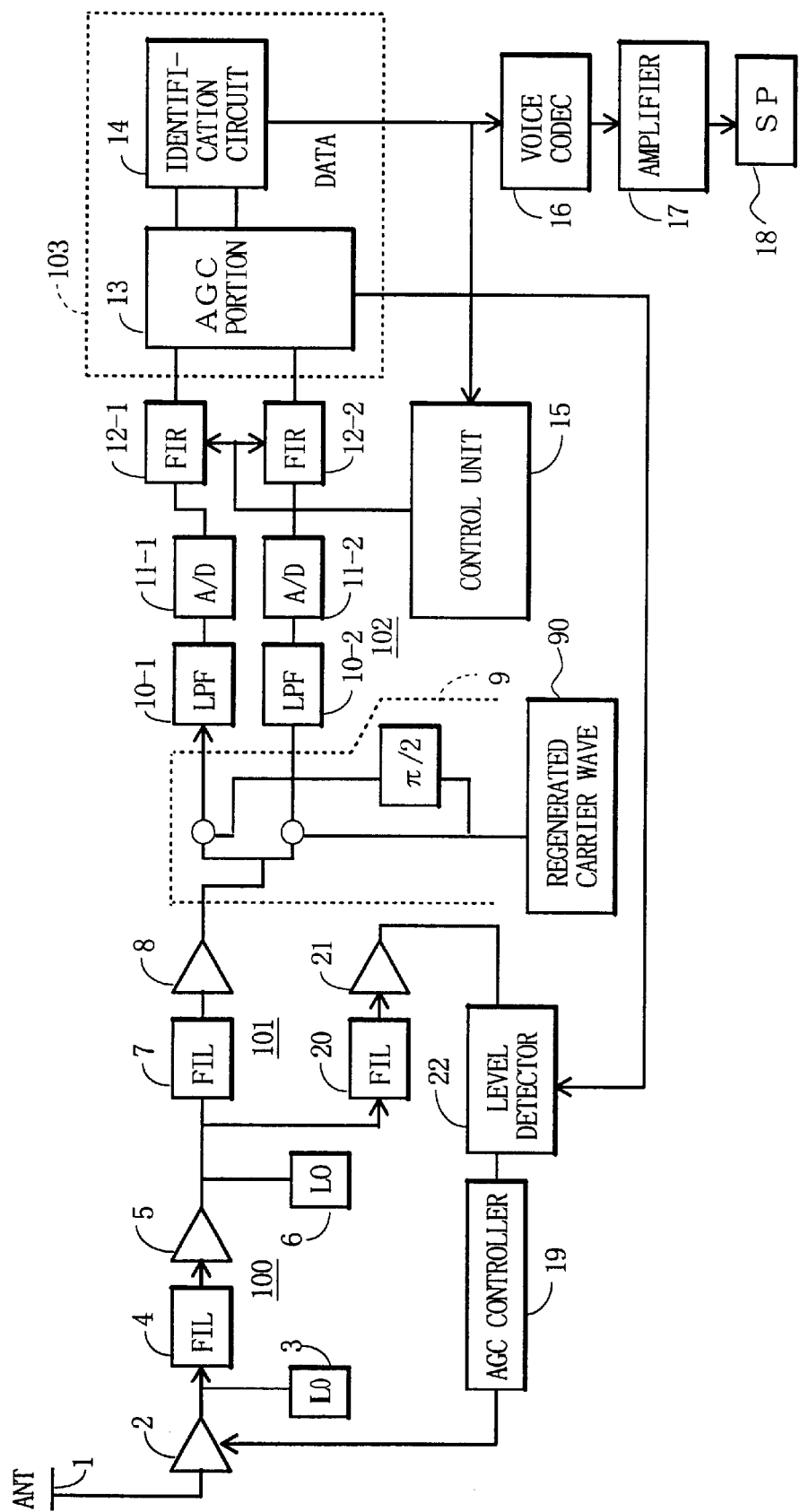
FIG. 18 is a block diagram showing an embodiment (8) of a digital wireless receiving apparatus according to the present invention.

FIG. 18 shows an embodiment (8) of the digital wireless receiving apparatus according to the present invention, and particularly shows a modified example in FIG. 11. In this embodiment, with respect to the AGC controller 19, the electric power information not only from the level detector 22 but also from the AGC portion 13 is used for the AGC control and the control unit 15 controls the tap number or the series stage number of the digital filters 12-1, 12-2.

Namely, the control unit 15 detects the AGC control period with the output data from the identification circuit 14. During the AGC control period, the tap number or the series stage number of the digital filters 12-1, 12-2 is controlled as mentioned above, and by providing the electric power information detected at the AGC portion 13 for the AGC controller 19, the AGC controller 19 performs the AGC control based on the sum of the input level of the desired wave from the level detector 22 and of the electric power information (AGC control signal) from the AGC portion 13. Therefore, the AGC control is performed only with the output of the level detector 22 upon the demodulation time.

Figure 19:
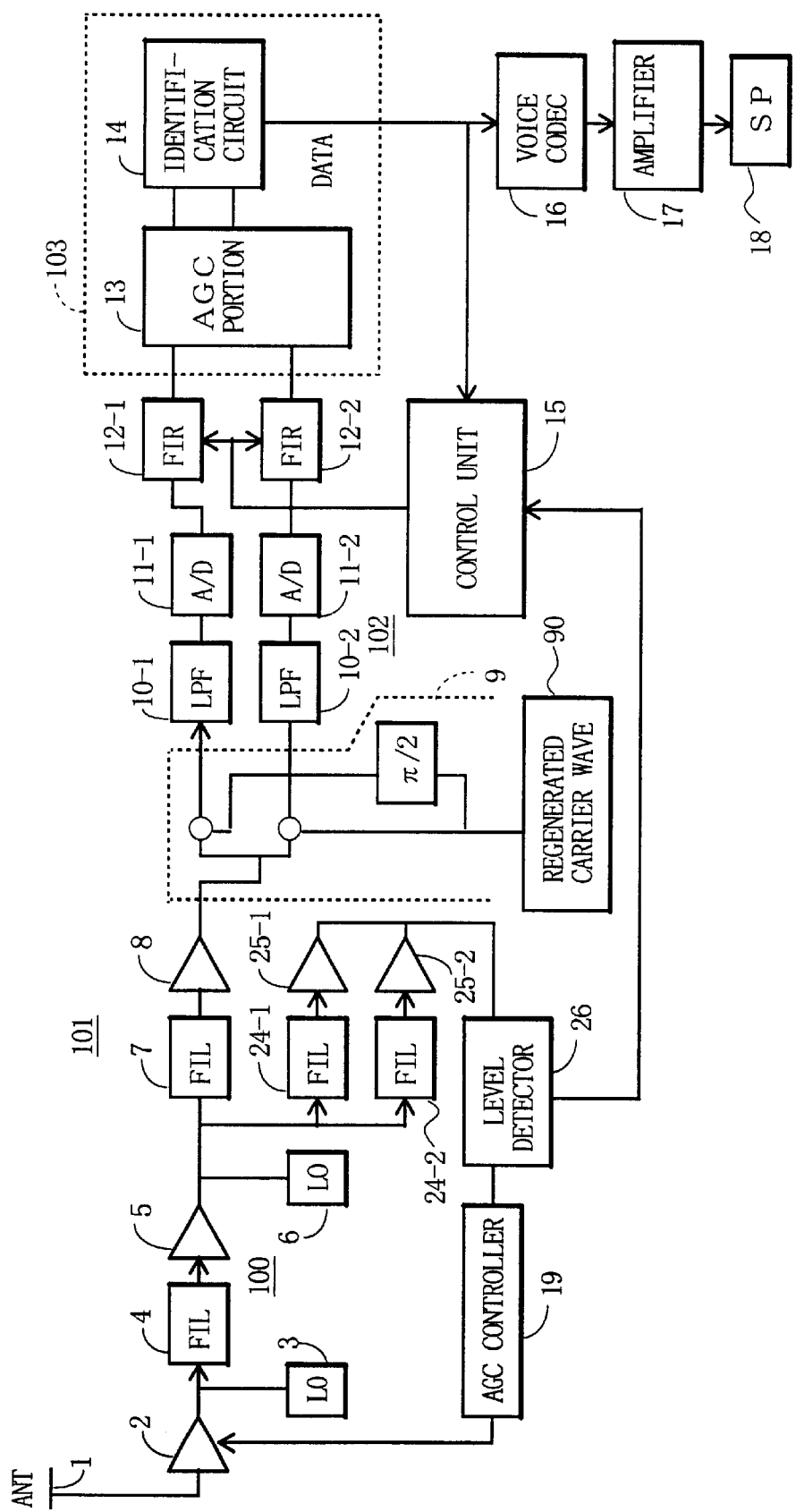
FIG. 19 is a block diagram showing an embodiment (9) of a digital wireless receiving apparatus according to the present invention.

FIG. 19 shows an embodiment (9) of the digital wireless receiving apparatus according to the present invention, and particularly shows a modified example of the embodiment of FIG. 15. In this embodiment, the control unit 15 controls the tap number or the series stage number of the digital filters 12-1, 12-2 based on the electric power output of the interfering wave detected at the level detector 26.

Namely, during the AGC control period by the TDMA or the TDD communication method, the level detector 26 detects the interfering wave electric power, depending on which the control unit 15 controls the tap number or the series stage number of the digital filters 12-1, 12-2 during the demodulation period. In this case, when the interfering wave level is large, the tap number or the series stage number of the digital filters 12-1, 12-2 are increased for removing the interfering wave while when the interfering wave level is small, that of the digital filters 12-1, 12-2 is decreased for shortening the delay time or the process time.

Figure 20:
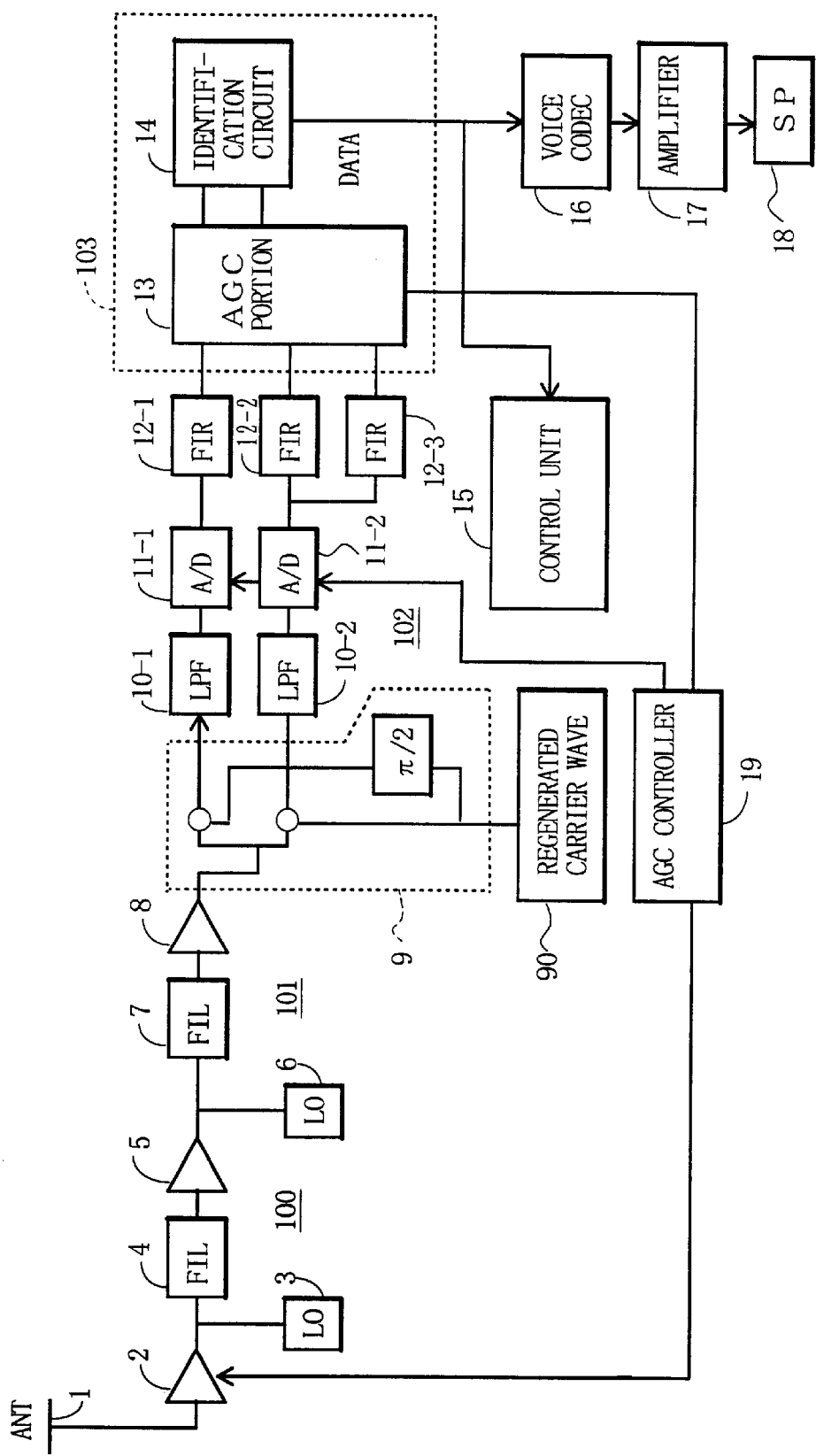
FIG. 20 is a block diagram showing an embodiment (10) of a digital wireless receiving apparatus according to the present invention.

FIG. 20 shows an embodiment (10) of the digital wireless receiving apparatus according to the present invention, and particularly shows a modified example of the embodiment in FIG. 15, which can also be applied to any of the above-mentioned embodiments (1)–(9).

Figure 21:
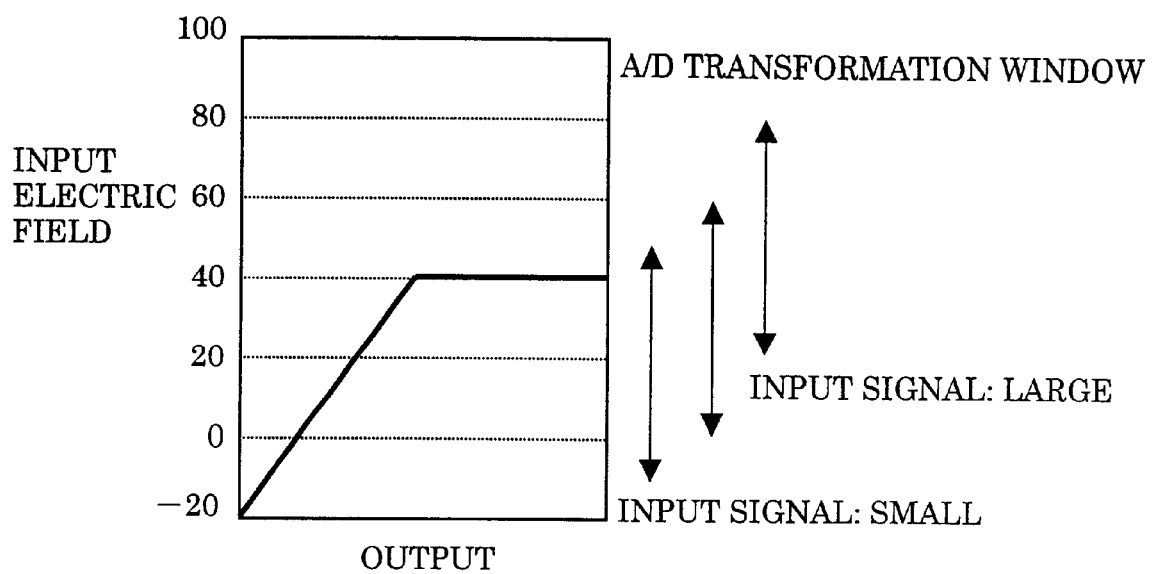
FIG. 21 is a graph illustrating an embodiment (10) of the present invention.
Figure 22:
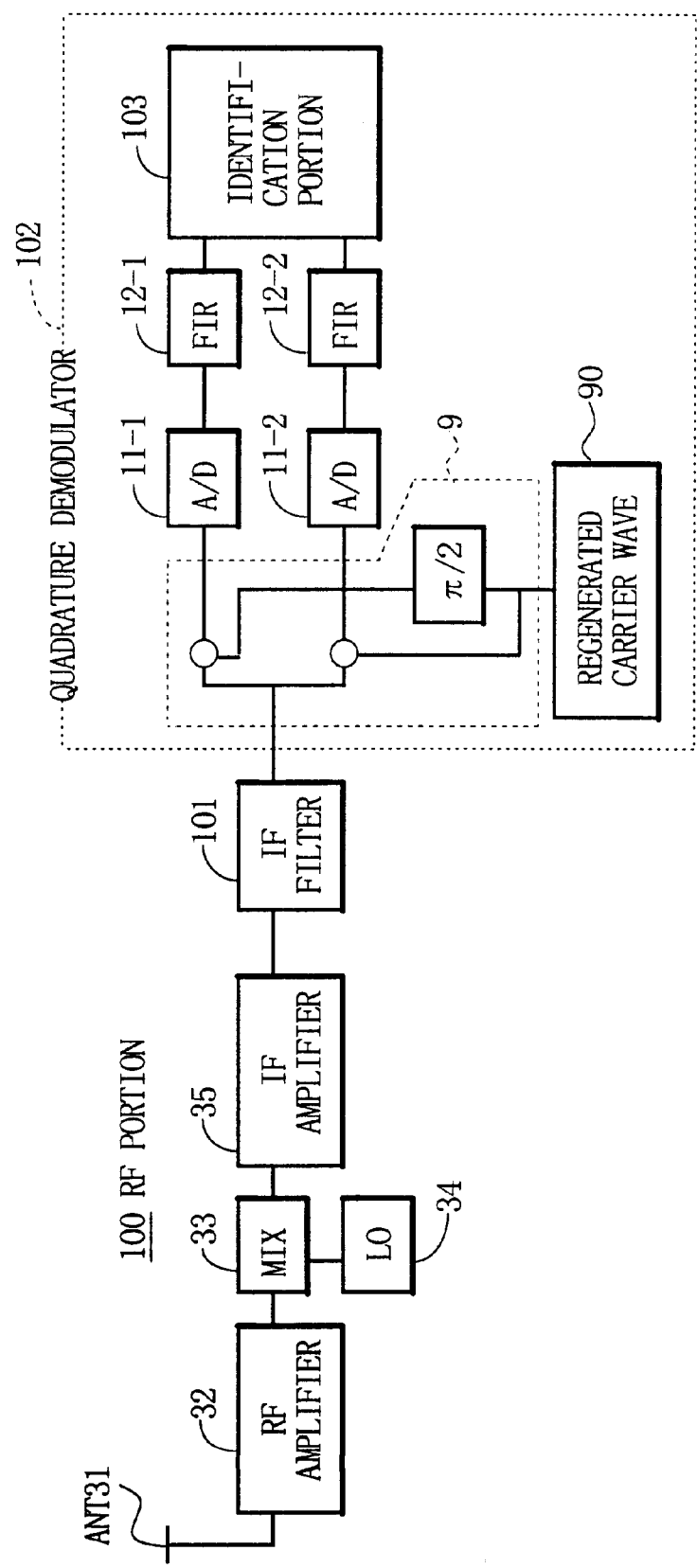
FIG. 22 is a block diagram showing an embodiment (1) of a conventional digital wireless receiving apparatus.
Figure 23:
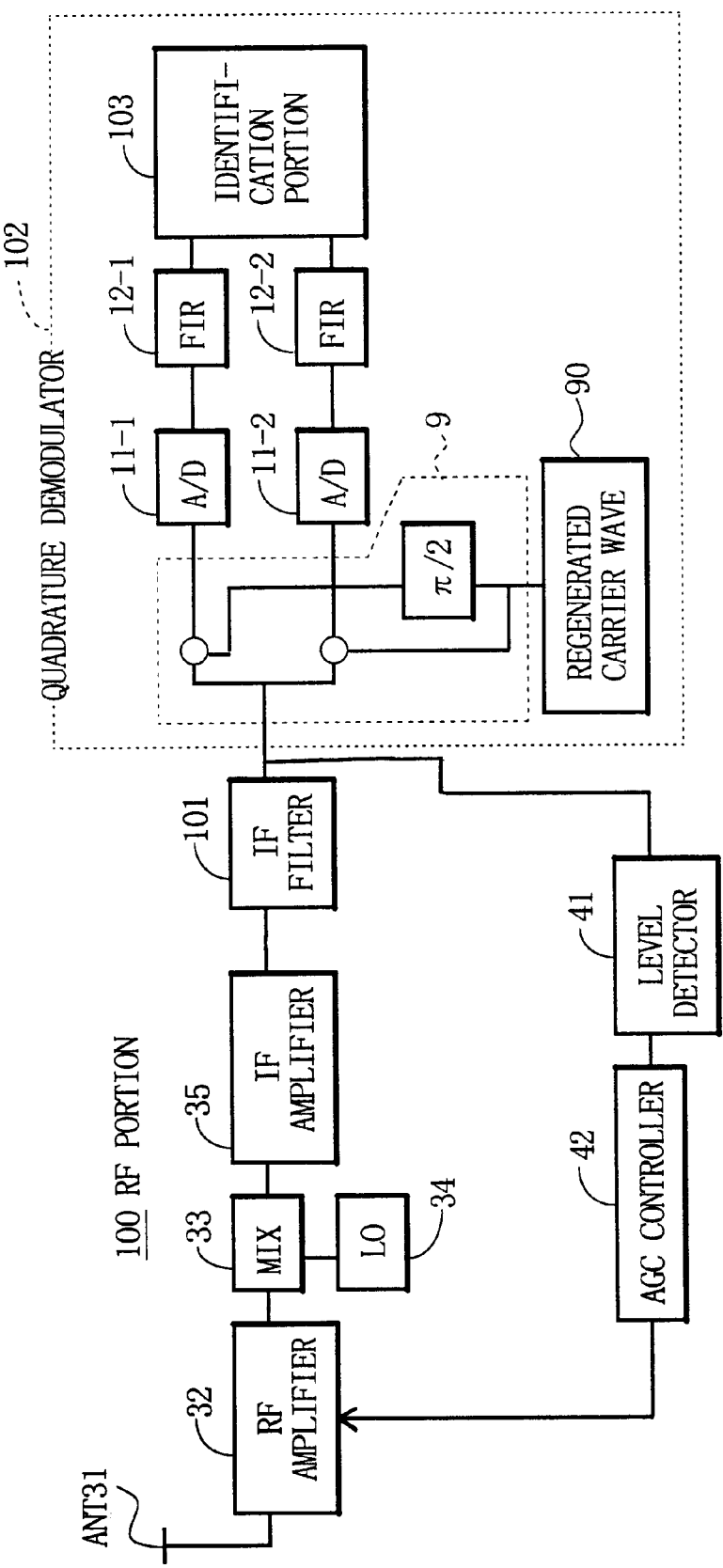
FIG. 23 is a block diagram showing an embodiment (2) of a conventional digital wireless receiving apparatus.
Figure 24A:
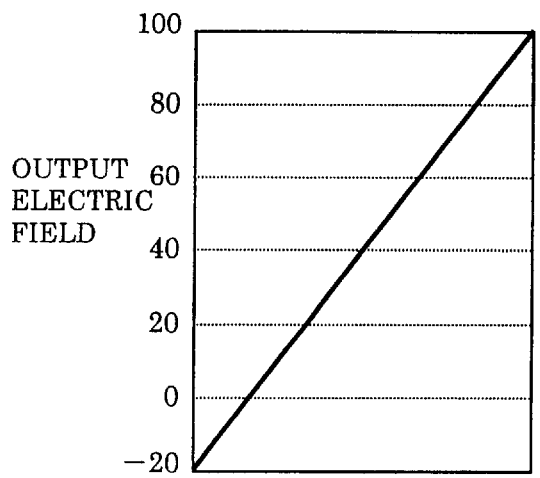
FIGS. 24A and 24B are graphs showing performance characteristics of a conventional digital wireless receiving apparatus (1)
Figure 24B:
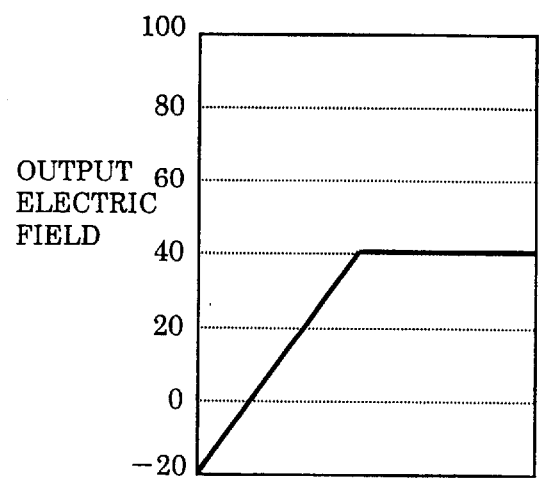
Figure 25A:
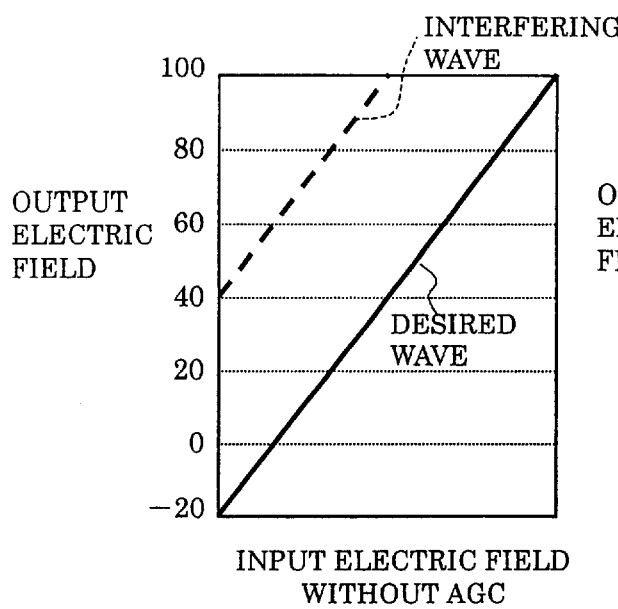
FIGS. 25A and 25B are graphs showing performance characteristics of a conventional digital wireless receiving apparatus (2)
Figure 25B:
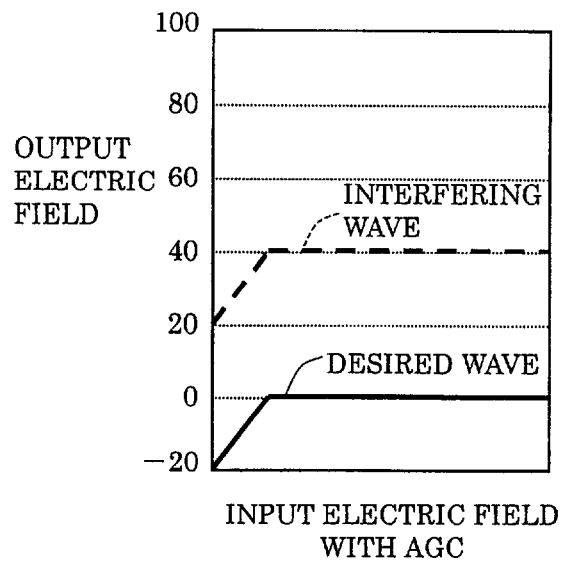
Figure 26:
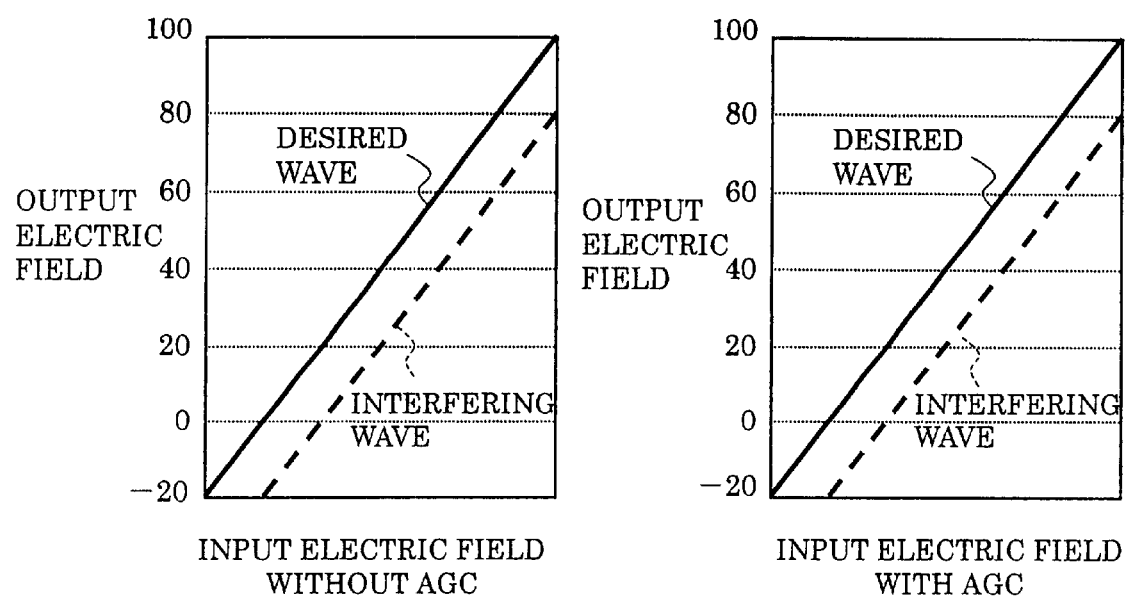
FIGS. 26A and 26B are graphs showing performance characteristics of a digital wireless receiving apparatus according to the present invention.

Namely, in the above-mentioned embodiments, if the desired wave signal level itself is comparatively high as shown in FIG. 21, the dynamic range of the A/D converters 11-1, 11-2 in the demodulator 102 can not be used effectively. Therefore, the A/D converters 11-1, 11-2 will recognize the input level of the interfering wave as smaller than it is, and the adjacent channel selection characteristic will deteriorate.

In the above-mentioned embodiments, since the detection of the desired wave signal and the interfering wave signal is comparatively accurately tried on purpose, by using the detected signal, a reference voltage of the A/D converters 11-1, 11-2 which is at the entrance of the demodulator 102 is made changeable by the control unit 19.

With this arrangement, it becomes possible to shift the windows of the A/D converters 11-1, 11-2 according to the desired wave signal and so expand a range for the best selectivity.

In the above-mentioned description, the digital filters can be composed of a gate array. In this case, a filter characteristic can be variably controlled externally.

Moreover, during the AGC control period, the reference voltage of the A/D converter may be controlled which performs A/D conversion directly into the intermediate frequency signal with the AGC control signal which has reduced the influence of the interfering wave by making the digital filters have a narrow band, resulting in an extended dynamic range for the adjacent channel's selectivity.

In the TDMA or the TDD communication method, the interfering wave level can be detected during the AGC control period, and with this detected information the tap number of the digital filters or an AGC.ON/OFF or an AGC gain control to the high frequency portion may be performed during the demodulation period.

In addition, the AGC detection filter may be composed of the digital filters which are at the following stage of the A/D converter.

As described above, a digital wireless receiving apparatus according to the present invention is arranged such that an AGC control is performed for a high frequency portion by detecting a desired wave level at a demodulator, a tap number or the like of a digital filter in the demodulator can be controlled if necessary, or another analog filter of an intermediate frequency is provided to detect an input level of an interfering wave or a desired wave, thereby performing the AGC control for the high frequency portion and controlling the tap number or the like of the digital filter at the demodulator if necessary. Therefore, a malfunction due to an interference from adjacent channels or the like can be prevented and a selectivity of the adjacent channels can be secured. Moreover, conflicting objects of the miniaturization of the receiver as well as the improvement of the adjacent channel's obstruction characteristic or the like can be achieved, whereby it becomes possible to use electric wave resources efficiently i.e. to make the pass band narrow.

What we claim is:

1. A digital wireless receiving apparatus comprising;
a high frequency portion which transforms a wireless reception signal into an intermediate frequency signal,
a first analog filter which secures a pass band characteristic of a desired wave in the intermediate frequency signal,
a second analog filter which is connected in parallel with the first analog filter, and which secures the pass band characteristic and an attenuation characteristic of the desired wave,
a demodulator which demodulates the digitally modulated signal outputted from the first analog filter, including a demodulating digital filter securing the pass band characteristic and having a tap number or a series stage number which can be changed, a control unit which sets the tap number or series stage number during the AGC control period larger than that during a demodulation period in order to detect only an input level of the desired wave during the AGC control period based on demodulation data obtained from an output of the digital filter, and an identification portion which generates an AGC control signal from an output digital filter,
a level detector which detects an input level of the desired wave from an output signal of the second analog filter, and an AGC controller which performs an AGC control to the wireless reception signal according to the sum of a detected level of the level detector and the AGC control signal.

2. A digital wireless receiving apparatus comprising;

a high frequency portion which transforms a wireless reception signal into an intermediate frequency signal, an analog filter which secures a pass band characteristic of a desired wave in the intermediate frequency signal, a demodulator which transforms the intermediate frequency signal, which is digitally modulated, outputted from the analog filter into a base band signal, including a first demodulating digital filter securing the pass band characteristic and having a tap number or a series stage number which can be changed, the second digital filter which is provided in parallel with the first digital filter and which has a high selectivity to extract only an input level of the desired wave, a control unit which detects the input level of the desired wave from an output signal of the second digital filter and which sets the tap number or the series stage number at the time when the input level is high less than that at the time when the input level is low, and an identification portion which generates an AGC control signal from an output of the first digital filter, and an AGC controller which secures a linear characteristic by performing the AGC control to the wireless reception signal according to the AGC control signal.

3. A digital wireless receiving apparatus comprising;

a high frequency portion which transforms a wireless reception signal into an intermediate frequency signal, an analog filter which secures a pass band characteristic of a desired wave in the intermediate frequency signal, a demodulator which demodulates the intermediate frequency signal, which is digitally modulated, outputted from the analog filter, including a demodulating digital filter securing the pass band characteristic and having a tap number or a series stage number which can be changed, a control unit which sets the tap number or series stage number during the AGC control period larger than that during a demodulation period in order to detect only an input level of the desired wave during the AGC control period based on demodulation data obtained from an output of the digital filter, and an identification portion which generates an AGC control signal from the output digital filter, and an AGC controller which secures a linear characteristic by performing the AGC control to the wireless reception signal according to the AGC control signal.

4. A digital wireless receiving apparatus comprising;

a high frequency portion which transforms a wireless reception signal into an intermediate frequency signal, an analog filter which secures a pass band characteristic of a desired wave in the intermediate frequency signal, a demodulator which demodulates the intermediate frequency signal, which is digitally modulated, outputted from the analog filter, including a demodulating digital filter securing the pass band characteristic which can be changed, a control unit which sets the pass band during the AGC control period larger than that during a demodulation period in order to detect only an input level of the desired wave during the AGC control period based on demodulation data obtained from an output of the digital filter, and an identification portion which generates an AGC control signal from the output digital filter, and an AGC controller which secures a linear characteristic by performing the AGC control to the wireless reception signal according to the AGC control signal.

5. A digital wireless receiving apparatus as claimed in claim 3 wherein the control unit divides the AGC control period into a period of detecting the input level of the desired wave and a period of detecting the input level of both the desired wave and an adjacent channel, and controls the AGC controller so that an AGC is performed in proportion to the ratio of both of the input levels.

6. A digital wireless receiving apparatus comprising;

a high frequency portion which transforms a wireless reception signal into an intermediate frequency signal, a first analog filter which secures a pass band characteristic of a desired wave in the intermediate frequency signal, a second analog filter which is connected in parallel with the first analog filter, and which secures the pass band characteristic and an attenuation characteristic of the desired wave, a demodulator which demodulates a digitally modulated signal outputted from the first analog filter, including a demodulating digital filter securing the pass band characteristic, a level detector which detects an input level of the desired wave from an output signal of the second analog filter, and an AGC controller which performs an AGC control to the wireless reception signal according to a detected level of the level detector.

7. A digital wireless receiving apparatus comprising;

a high frequency portion which transforms a wireless reception signal into an intermediate frequency signal, a first analog filter which secures a pass band characteristic of a desired wave in the intermediate frequency signal, a second analog filter which is connected in parallel with the first analog filter, and which secures the pass band characteristic and an attenuation characteristic of the desired wave, a demodulator which demodulates a digitally modulated signal outputted from the first analog filter, including a demodulating digital filter securing the pass band characteristic, a switch which switches over outputs of the first and the second analog filter, a control unit which controls the switch so as to select an output of the second analog filter only during the AGC control period based on demodulation data obtained from an output of the digital filter, a level detector which detects an input level of the desired wave from an output signal of the switch, and an AGC controller which forms the demodulator and performs the AGC control to the wireless reception signal according to a detected level of the level detector.

8. A digital wireless receiving apparatus comprising;

a high frequency portion which transforms a wireless reception signal into an intermediate frequency signal, a first analog filter which secures a pass band characteristic of a desired wave in a base band signal, a second analog filter which is connected in parallel with the first analog filter, and which has a low and a high pass band which pass an interfering wave therethrough, a demodulator which demodulates a digitally modulated signal outputted from the first analog filter, including a demodulating digital filter to secure the pass band characteristic, a level detector which detects an input level of the interfering wave from an output signal of the second analog filter, and an AGC controller which performs an AGC control to the wireless reception signal in inverse proportion to a detected level of the level detector.

9. A digital wireless receiving apparatus comprising;

a high frequency portion which transforms a wireless reception signal into an intermediate frequency signal, a first analog filter which secures a pass band characteristic of a desired wave in the intermediate frequency signal, a second analog filter which is connected in parallel with the first analog filter, and which secures the pass band characteristic and an attenuation characteristic of the desired wave, a demodulator which demodulates the digitally modulated signal outputted from the first analog filter, including the demodulating digital filter securing the pass band characteristic and having a tap number or a series stage number which can be changed, a level detector which detects an input level of the desired wave from an output signal of the second analog filter, an AGC controller which performs an AGC control to the wireless reception signal according to a detected level of the level detector, and a control unit which forms the demodulator and which changes the tap number or the series stage number of the digital filter according to the detected level of the level detector.

10. A digital wireless receiving apparatus as claimed in claim 3 wherein the AGC control period is a preamble period.

11. A digital wireless receiving apparatus as claimed in claim 5 wherein the AGC control period is a preamble period.

12. A digital wireless receiving apparatus as claimed in claim 7 wherein the AGC control period is a preamble period.

13. A digital wireless receiving apparatus as claimed in claim 3 wherein the AGC control period is a non-communication section in TDMA or TDD communication method.

14. A digital wireless receiving apparatus as claimed in claim 5 wherein the AGC control period is a non-communication section in TDMA or TDD communication method.

15. A digital wireless receiving apparatus as claimed in claim 7 wherein the AGC control period is a non-communication section in TDMA or TDD communication method.

16. A digital wireless receiving apparatus as claimed in claim 8 wherein the level detector detects electric power of the interfering wave during the AGC period in the TDMA or the TDD method, and according to the electric power of the interfering wave the control unit controls the tap number or the series stage number of the digital filter during the demodulation time.

* * * * *